(12) United States Patent
Mueller

(10) Patent No.: US 6,882,217 B1
(45) Date of Patent: Apr. 19, 2005

(54) CUBIC SPLINE PREDISTORTION, ALGORITHM AND TRAINING, FOR A WIRELESS LAN SYSTEM

(75) Inventor: A. Joseph Mueller, San Diego, CA (US)

(73) Assignee: 3com Corporation, Marlborough, MA (US)

( * ) Notice: Subject to any disclaimer, the term of this patent is extended or adjusted under 35 U.S.C. 154(b) by 64 days.

(21) Appl. No.: 10/259,108

(22) Filed: Sep. 27, 2002

(51) Int. Cl.[7] .............................................. G01R 19/00
(52) U.S. Cl. ........................................ 330/2; 330/149
(58) Field of Search ..................... 330/2, 149; 375/297; 702/66, 69–74, 85, 106, 107, 179, 181, 189

(56) References Cited

U.S. PATENT DOCUMENTS

| | | | |
|---|---|---|---|
| 5,764,706 A | | 6/1998 | Carlin et al. |
| 5,920,808 A | * | 7/1999 | Jones et al. .............. 455/127.1 |
| 6,313,703 B1 | | 11/2001 | Wright et al. |
| 6,392,480 B1 | | 5/2002 | Ghanadan et al. |
| 6,798,843 B1 | * | 9/2004 | Wright et al. ............... 375/296 |

OTHER PUBLICATIONS

Frank Zavosh, et al. "Digital Predistortion Linearizes CDMA LDMOS Amps" Microwaves & RF Mar. 2000, pp. 55–56, 58–59, 61 and 164.

Frank Zavosh, et al. "Digital Predistortion Techniques for RF Power Amplifiers with CDMA Applications" Microwave Journal, Oct. 1999, consisting of 8 pages.

Maria–Gabriella Di Benedetto and Paolo Mandarini "An Application of MMSE Predistortion to OFDM Systems" IEEE Transactions on Communications, vol. 44, No. 11 Nov. 1996, pp. 1417–1420.

James Lilly and Dr. Frank Zavosh "Variable Delay Lines Enhance Feedforward Power Amplifiers and Bypass Applications" Microwave Product Digest, Sep. 2001 consisting of 5 pages.

David Runton et al. "Gauge the Impact of Modulator Compensation on CMDA Performace" Wireless Systems Design Jul. 2000, consisting of 4 pages.

Mauri Honkanen and Sven–Gustav Haggman "New Aspects on Nonlinear Power Amplifier Modeling in Radio Communication System Simulations" IEEE May 1997, pp. 844–848.

Adel A.M. Saleh "Frequency–Independent and Frequency Dependent Nonlinear Models of TWT Amplifiers" IEEE Transactions on Communications, vol. Com–29, No. 11, Nov. 1981, pp. 1715–1720.

Krzystof Wesolowski, et al. "Efficient Algorithm for Adjustment of Adaptive Predistorter in OFDM Transmitter" IEEE 2000, pp. 2491–2496.

Davide Dardari "A Theoretical Characterization of Nonlinear Distortion Effects in OFDM Systems" IEEE Transactions on Communications, vol. 48, No. 10 Oct. 2000, pp. 1755–1763.

A.R. Kaye et al. "Analysis and Compensation of Bandpass Nonlinearities for Communications" IEEE Transactions on Communications, Oct. 1971, pp. 965–972.

(Continued)

*Primary Examiner*—Henry Choe
(74) *Attorney, Agent, or Firm*—Ernest J. Beffel; Haynes Beffel & Wolfeld LLP

(57) ABSTRACT

The present invention includes methods and devices to apply predistortion to correct nonlinearities of a power amplifier in an OFDM symbol transmission system. More particularly, predistortion is patterned to take into account clipping of symbols and to match an effective input range of the predistorter with an average power output of the power amplifier. This invention may be applied to a variety of standards utilizing OFDM technology, including IEEE 802.11a, Hiperlan/2 and MMAC.

22 Claims, 26 Drawing Sheets

OTHER PUBLICATIONS

A. Ghorbani and M. Sheikhan "The Effect of Solid State Power Amplifiers (SSPAs) Nonlinearities on MPSK and M–QAM Signal Transmission" Digital Processing of Signals in Communications, 1991, Sixth International Conference on Sep. 2–6, 1991, pp. 193–197.

Haobo Lai and Yeheskel Bar–Ness "A New Predistorter Design for Nonlinear Power Amplifiers Using the Minimum Distortion Power Polynomial Model (MDP–PM)" IEEE Aug. 2001 consisting of 5 pages.

Chris van den Bos and Michiel H.L. Kouwenhoven "Effect of Smooth Nonlinear Distoration on OFDM Symbol Error Rate" IEEE Transactions on Communications, vol. 49, No. 9 Sep. 2001, pp. 1510–1514.

Takaaki Horiuchi et al. "Performance Evaluation of OFDM with the Compensation Technique of the Nonlinear Distortion Using Partial Transmit Sequence and Predistortion" IEEE Aug. 2001, consisting of 5 pages.

Weiyun Shan et al. "Spectral Sensitivity of Predistortion Linearizer Architectures to Filter Ripple" IEEE Aug. 2001, consisting of 5 pages.

Javad Yavand Hassani and Mahmood Kamareei "Quantization Error Improvement in a Digital Predistorter for RF Power Amplifier Linearization" IEEE Aug. 2001, consisting of 4 pages.

Hideo Yoshimi and Tomoaki Ohtsuki "An OFDM System with Modified Predistorter and MLS" IEEE Aug. 2001, consisting of 5 pages.

Sylvia Lin et al. "Quadrature Direct Conversion Receiver Integrated with Planar Quasi–Yagi Anetnna" IEEE MTT–S Intl. Microwave Symposium Digest, pp. 1285–1288, Jun. 2000, consisting of 4 pages.

J. Riches et al. "Statistical Error Shaping for Mismatch Cancellation in Complex Bandpass Delta–Sigma Modulators" Signal Processing Systems, 2000, SiPS 2000, 2000 IEEE Workshop on Oct. 11–13, 2000, pp. 771–780.

J.H. Mikkelsen et al. "Feasability Study of DC Offset Filtering for UTRA–FDD/WCDMA Direct–Conversion Receiver" Proceedings of 17th IEEE NORCHIP Conference, Olso, Norway, Nov. 1999, pp. 34–39.

Jan H. Mikkelsen "Evaluation of CMOS Front–End Receiver Architectures for GSM Handset Applications" Proc. of IEEE First International Symposium on Communications Systems & Digital Signal Processing (CSDSP), Sheffield, England pp. 164–167, Apr. 1998.

Joshua W. Shao et al. "Impact of Fading Correlation and Unequal Branch Gains on the Capacity of Diversity Systems" Proceedings of the IEEE Vehicular Technology Conference (VTC'99), pp. 2159–2159, May 1999.

Jack P.F. Glas "Digital I/Q Imbalance Compensation In A Low–If Receiver" Bell Labs, Lucent Technologies 1998 consisting of 6 pages.

* cited by examiner

|  | Vs = 3.30 V Room Temperature | | Vs = 3.30 V Room Temperature | |
|---|---|---|---|---|
| RF in dBm | Gain dB | Phase degrees | Gain dB | Phase degrees |
| -15 | 22.01 | 0.30 | 21.80 | 0.00 |
| -14 | 22.01 | 0.30 | 21.80 | 0.00 |
| -13 | 22.01 | 0.30 | 21.80 | 0.10 |
| -12 | 22.01 | 0.20 | 21.80 | 0.13 |
| -11 | 22.01 | 0.20 | 21.80 | 0.20 |
| -10 | 22.00 | 0.10 | 21.80 | 0.26 |
| -9 | 22.00 | 0.10 | 21.80 | 0.34 |
| -8 | 22.00 | -0.10 | 21.80 | 0.40 |
| -7 | 21.90 | -0.20 | 21.80 | 0.49 |
| -6 | 21.90 | -0.30 | 21.80 | 0.62 |
| -5 | 21.90 | -0.50 | 21.80 | 0.80 |
| -4 | 21.90 | -0.60 | 21.80 | 1.02 |
| -3 | 21.80 | -0.80 | 21.77 | 1.33 |
| -2 | 21.80 | -0.90 | 21.74 | 1.74 |
| -1 | 21.70 | -0.90 | 21.68 | 2.33 |
| 0 | 21.50 | -0.70 | 21.58 | 3.19 |
| 1 | 21.30 | -0.30 | 21.41 | 4.24 |
| 2 | 20.90 | 0.00 | 21.21 | 5.23 |
| 3 | 20.60 | -0.20 | 20.92 | 5.80 |
| 4 | 20.07 | -0.90 | 20.54 | 5.65 |
| 5 | 19.50 | -2.15 | 20.06 | 4.92 |
| 6 | 18.80 | -3.56 | 19.50 | 3.83 |
| 7 | 18.10 | -5.07 | 18.84 | 2.59 |
| 8 | 17.30 | -6.50 | 18.11 | 1.33 |
| 9 | 16.40 | -7.70 | 17.32 | 0.19 |
| 10 | 15.40 | -8.60 | 16.50 | -0.81 |
| 11 | 14.30 | -8.90 | 15.64 | -1.60 |

Fig. 6

CUBIC SPLINE PREDISTORTION, ALGORITHM AND TRAINING, FOR A WIRELESS LAN SYSTEM

CROSS-REFERENCE TO RELATED APPLICATIONS

This application is related to the commonly owned, U.S. patent application Ser. No. 10/259,082, filed Sep. 27, 2002, entitled "Gain and Phase Imbalance Compensation for OFDM Systems" by the same inventor. The related application is hereby incorporated by reference.

BACKGROUND OF THE INVENTION

The present invention includes methods and devices to apply predistortion to correct nonlinearities of a power amplifier in an OFDM symbol transmission system. More particularly, predistortion is patterned to take into account clipping of symbols and to match an effective input range of the predistorter with an average power output of the power amplifier. This invention may be applied to a variety of standards utilizing OFDM technology, including IEEE 802.11a, Hiperlan/2 and MMAC.

A major challenge in OFDM transceiver design is ensuring the linearity of the transmitter and particularly the RF power amplifier (PA). The PA has a maximum output amplitude that is determined in part by the power supply and by the PA efficiency. As the input levels become large, the PA approaches saturation and the output amplitude and phase no longer display a linear relationship with the input. This non-linearity causes spectral regrowth due to intermodulation products and loss in transmit modulation accuracy. These effects are particularly evident in systems compliant with the wireless networking standard 802.11a, where the transmit signal has a large dynamic range and large constellations are used requiring greater transmit signal fidelity.

The typical approaches to PA non-linearity are to either increase the power backoff (i.e. decreasing the input range to the PA such that the PA operates in its more linear region) at the cost of output power and PA efficiency or to use a more linear and consequently more expensive PA. Less typical approaches include LFNC transmitters and analog feedback compensation circuits. A LINC transmitter consists of two parallel transmitters each transmitting a fixed magnitude signal. By adjusting the phase between the two signals and summing them, any variable magnitude signal can be generated.

An alternate method of avoiding PA non-linearities is to reduce the dynamic range of the transmit signal using peak to average ratio (PAR) reduction techniques. Unfortunately, due to the design constraints imposed by 802.11a compliance, the performance of PAR reduction techniques alone is not anticipated to be very significant.

Accordingly, an opportunity arises to develop an OFDM predistortion method and apparatus that improves system performance.

SUMMARY OF THE INVENTION

The present invention includes methods and devices to apply predistortion to correct nonlinearities of a power amplifier in an OFDM symbol transmission system. According to one aspect of the invention, attention is paid to clipping of symbols and to matching an effective input range of the predistorter with an average power output of the power amplifier. This invention may be applied to a variety of standards utilizing OFDM technology, including IEEE 802.11a, Hiperlan/2 and MMAC. Further description of the invention and its embodiments are found in the figures, specification and claims that follow.

BRIEF DESCRIPTION OF THE DRAWINGS

FIG. 6 is a table of measured results from power amplifier characterization.

DETAILED DESCRIPTION

Figure 1:
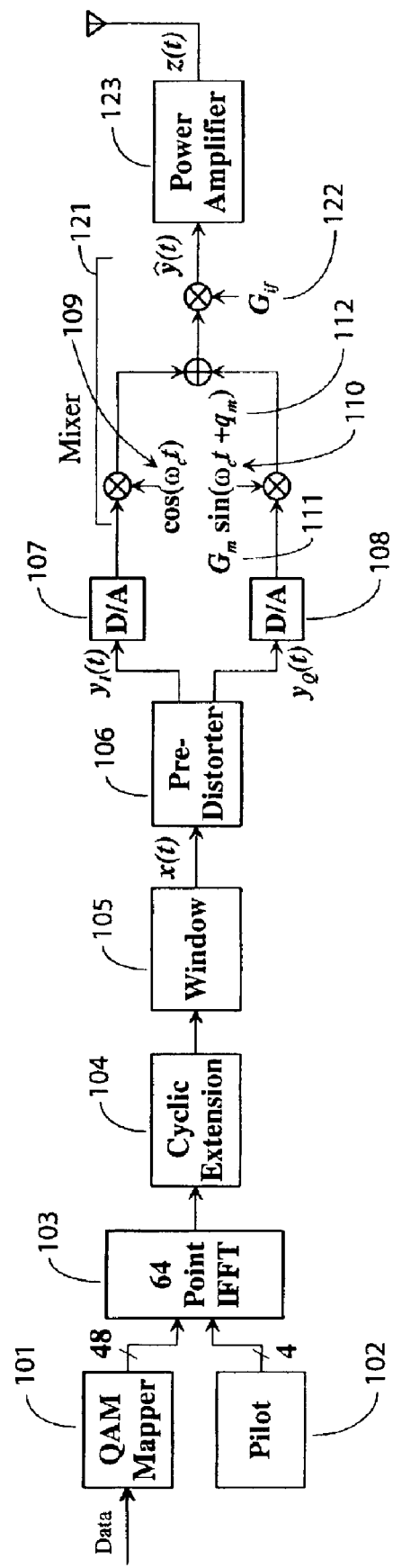
FIG. 1 illustrates an OFDM transmitter model.

The following detailed description is made with reference to the figures. Preferred embodiments are described to illustrate the present invention, not to limit its scope, which is defined by the claims. Those of ordinary skill in the art will recognize a variety of equivalent variations on the description that follows.

Glossary and Nomenclature

Many symbols are used in this application, so their meanings are set out here for reference.

AM     Amplitude Modulation
BPSK     Binary Phase Shift Keying

-continued

| | |
|---|---|
| cdf | Cumulative Distribution Function |
| CDMA | Code Division Multiple Access |
| D/A | Digital to Analog converter |
| FFT | Fast Fourier Transform |
| GaAs | Galium Arsinide (in reference to type of PA) |
| IEEE | Institute of Electrical and Electronic Engineers |
| IF | Intermediate Frequency |
| IFFT | Inverse Fast Fourier Transform |
| OFDM | Orthogonal Frequency Division Multiplexing |
| OSR | Over Sample Rate |
| PA | Power Amplifier |
| PAR | Peak to Average Ratio |
| PBO | Power Back-Off |
| PD | Pre-distortion |
| pdf | Probability Density Function |
| PM | Phase Modulation |
| PSD | Power Spectral Density |
| QPSK | Quadrature Phase Shift Keying |
| QAM | Quadrature Amplitude Modulation |
| RF | Radio Frequency |
| RMS | Root Mean Squared |
| TMAT | Transmitter Modulation Accuracy Test |
| TWT | Traveling Wave Tube (in reference to type of PA) |
| A[r(t)] | represents AM-to-AM conversion of PA |
| $b_k^{(l)}$ | k-th sample of the l-th OFDM symbol at the output of the IFFT |
| $c_k^{(l)}$ | k-th sample of the l-th OFDM symbol after cyclic extension |
| $d_n^{(l)}$ | encoded data symbol on the n-th carrier of the l-th OFDM symbol |
| F(·) | cumulative distribution function of the argument |
| $G_{if}$ | gain of IF stage (i.e. due to D/A's, mixer and/or pre-amplifier) |
| $G_m$ | gain imbalance of the mixer |
| k | time (sampled - see continuous time t) |
| l | OFDM symbol number |
| $\lambda(\rho^2)$ | linearizing function of the predistorter |
| n | OFDM carrier number (equivalently, frequency index) |
| N | number of points evaluated in IFFT |
| $N_{bpsc}$ | number of bits encoded onto each subcarrier |
| $N_{cp}$ | length of cyclic prefix in samples |
| $N_{tr}$ | length of OFDM symbol overlap used for windowing in samples |
| osr | oversample rate |
| p(·) | probability density function of argument |
| $P_{BO}$ | power back-off of PA |
| ψ(t) | phase of ŷ(t) (modulated phase before PA) |
| $\theta_m$ | phase imbalance of the mixer |
| ρ | magnitude of x(t) |
| $\rho_{clip}$ | clipping level of the magnitude of x(t) due to PA saturation |
| r(t) | magnitude of ŷ(t) (modulated envelope before PA) |
| $r_{clip}$ | maximum amplitude of r(t) beyond which r(t) is clipped |
| $\sigma_x$ | variance of x(t) (also square root of average energy of x(t)) |
| t | time (continuous - see sampled time, k) |
| T | OFDM symbol period (4 μsec for 802.11a) |
| $\omega_c$ | RF carrier frequency in radians |
| $w_T(k)$ | windowing function applied to OFDM symbols |
| x(t) | OFDM transmit symbol, input to the pre-distorter |
| $x_I(t)$ | in-phase (real) component of x(t) |
| $x_Q(t)$ | quadrature (imaginary) component of x(t) |
| $x_{clip}$ | maximum amplitude of r(t) beyond which r(t) is clipped |
| y(t) | output from the predistorter, input to the D/A's and mixer |
| $y_I(t)$ | in-phase (real) component of y(t) |
| $y_Q(t)$ | quadrature (imaginary) component of y(t) |
| ŷ(t) | output from the mixer, input to the PA (baseband model) |
| $ŷ_I(t)$ | in-phase (real) component of ŷ(t) |
| $ŷ_Q(t)$ | quadrature (imaginary) component of ŷ(t) |
| $z_{RF}(t)$ | output from the PA, RF signal to be transmitted over the air |
| $z_{ideal}(t)$ | output from the PA with perfect predistortion (baseband) |
| $z_{perfect}(t)$ | output from the PA if it were perfect, non-saturating (baseband) |
| z(t) | output from the PA, baseband equivalent |
| $z_I(t)$ | in-phase (real) component of z(t) |
| $z_Q(t)$ | quadrature (imaginary) component of z(t) |

Two approaches have been developed to apply predistortion to precompensate for non-linearities of a PA such that the output of the PA is linearly proportional to the input to the predistorter. The approaches are individual amplitude and phase compensation using polynomials, and compensation using a lookup table with cubic spline interpolation. For each, the theory, performance and implementation complexity are described. Performance is described in terms of spectral regrowth, transmit signal integrity and link margin. The performance is determined progressively, first using standard power amplifier models and then using measurements from real power amplifiers. To evaluate performance, a large selection of production PA's were characterized to determine their sensitivity to temperature, supply voltage and age as well as to determine the variability in the PA's themselves.

While the results below are described in terms of the wireless networking 802.11a standard, those of skill in the art will recognize many extensions of these sets including extension to all OFDM symbol systems.

802.11a Transmitter Model

FIG. 1 illustrates the OFDM transmitter model used to analyze the effects of the PA and the performance of the predistorter. This model incorporates all the functionality of the 802.11a transmitter at the OFDM symbol level and below. It does not incorporate the 802.11a framing, scrambling, or convolutional encoding/interleaving, which were not necessary for this evaluation. The radio model consists of digital-to-analog converters (D/A's), a mixer and a PA. A predistorter is inserted between the OFDM transmitter and radio to pre-compensate for non-linearities introduced by the PA. The predistorter is not mandated (or mentioned) in the 802.11a standard. IEEE Std 802.11a, *Part 11: Wireless LAN Medium Access Control (MAC) and Physical Layer (PHY) Specifications: High-speed Physical Layer in the 5 GHz Band,* 1999. Reconstruction filters between the D/A's and the PA are assumed to have negligible effects and thus are ignored in this analysis. Those of skill in the art will recognize that additional steps may be implemented to address ripple and delay introduced by reconstruction filters.

OFDM symbols typically include 48 data carriers 101 and 4 pilot carriers 102. The data carriers are modulated by a set of data symbols whose values for the purpose of this evaluation are independent, uniformly distributed random variables over the range of 0, 1, . . . , $2^{N_{bpsc}}-1$ where $N_{bpsc}$ represents the number of bits encoded onto each subcarrier. $N_{bpsc}$ may equal to 1, 2, 4 and 6 bits corresponding to grey-coded BSPK, QPSK, 16-QAM and 64-QAM constellations, respectively. The QAM Mapper maps each data symbol to its corresponding complex value. The pilot carriers are encoded as BPSK symbols with psuedo-randomly alternating phases in accordance with 802.11a.

The data and pilot carriers are combined into $d^{n(l)}$, n=0, . . . , 63 complex points, and translated to the time domain by an N=64-point complex IFFT 103. Each block of N samples output from the IFFT forms a single OFDM symbol, which is then cyclic extended (104) with $N_{cp}$=16 samples and windowed 105. Although 802.11a specifies a raised cosine window of arbitrary length $w_T$ (where $w_T$ represents the number of samples overlap between adjacent OFDM symbols), its use is optional. For this analysis, windowing with $w_T$=1 was used to meet the PSD requirement of 802.11a. Oversampling of the transmit signal can be performed either in the time-domain using standard interpolation techniques or in the frequency domain by performing an osr×N-point IFFT on a zero padded input, where osr represents the oversampling rate. For this analysis, oversampling is performed in the frequency domain and $N_{cp}$ and $w_T$ are correspondingly scaled by osr.

The predistortion block 106 distorts the signal prior to the PA to compensate for the non-linear effects of the PA. These PA non-linearities reduce the integrity of the transmit signal and cause spectral regrowth.

The two D/A's convert the in-phase 107 and quadrature 108 components of the digital baseband signal 109, 110 to the analog domain for input to the mixer. The mixer 121 is modeled as a direct-to-RF mixer, for this analysis. The mixer includes a gain imbalance $G_m$ (111) and phase imbalance $\theta_m$ or $q_m$ (112) which are applied to the quadrature branch (110). The mixer also includes an IF gain, $G_{cf}$ (122) prior to the PA 123 which accounts for gains in the A/D's, mixer and pre-amplifier, if present.

The peak-to-average ratio (PAR) and amplitude distribution of the transmit signal are of particular interest in this analysis. These, along with a description of the baseband model are presented below.

Baseband Model

The baseband model represents the effects of the RF components in terms of their effects on the baseband signal, without taking into account up-sampling of the signal to RF, because up-sampling to RF adds nothing and significantly increases simulation times. The output of the IFFT block for the 1-th OFDM symbol is $$b_k^{(l)} = \frac{1}{N}\sum_{n=0}^{N-1} d_n^{(l)} e^{j2\pi nk/N},$$

$k=0,\ldots,N-1$ where $N=osr \times 64$ and $d_n^{(l)}$ is the complex constellation point for the n-th carrier of the 1-th symbol. The last $osr \times 16$ samples of $b_k^{(l)}$ are copied and prepended to the sequence forming the cyclically extended sequence, $c_k^{(l)} = [b_{N-N_{cp}}^{(l)}, \ldots b_{N-1}^{(l)}, b_0^{(l)}, b_1^{(l)}, \ldots, b_{N-1}^{(l)}]$. This sequence typically is windowed to improve spectral characteristics of the signal by the windowing function $w_T(k)$ to obtain the output, as a function of time over an infinite number of symbols, $$x(k) = \sum_{l=-\infty}^{\infty} \sum_{n=0}^{N-1} d_n^{(l)} e^{j2\pi nk/N} w_T(k - lN'),$$

$l=[k/N']$ where T is the symbol spacing and $N'=N+N_{cp}$. The power spectral density (PSD) of x(k) is derived in a section of the appendix, incorporating the effects of the windowing function.

The signal, x(k), represents the input to the predistorter. The output of the predistorter is $$y(k)=\lambda(\rho^2) \times (k) \text{ where } \rho^2=x_1^2(k)+x_Q^2(k)$$

and $\lambda(\rho^2)$ is the complex linearizing function determined during training. This linearizing function is the inverse response of the PA to the point where the PA saturates. Inherently, the predistorter cannot linearize the PA beyond its saturation point.

The signal y(k) is separated into its in-phase and quadrature components, $y_1(k)$ and $y_Q(k)$, respectively, and individually converted to analog by the pair of D/A's. The non-linearities of the D/A's (with the exception of clipping) are assumed to be negligible and any imbalance can be combined with the gain and phase imbalance ($G_m$ and $\theta_m$) introduced by the mixer. The output of the mixer 121 is $$\hat{y}(t)=G_{tf}[y_1(t)\cos(\omega_c t)-G_m y_Q(t)\sin(\omega_c t+\theta_m)]$$

where $\omega_c$ is the carrier frequency in radians ($\omega_c=2\pi f_c$). Use of t, in this equation, is interchangeable with k, as $t=k \times 4 \times 10^{-6}/(osr \times 80)$. Using basic trigonometric properties, this can be rewritten as $$\hat{y}(t)=\hat{y}_1(t)\cos(\omega_c t)-\hat{y}(t)\sin(\omega_c t)$$

where $$\hat{y}_1(t)=G_{cf}[y_1(t)-G_m y_Q(t)\sin(\theta_m)]$$

and $$\hat{y}_Q(t)=G_{tf}G_m y_Q(t)\cos(\theta_m)$$

represent the baseband equivalent models of the mixer (i.e., the $\cos(w_c t)$ and $\sin(\omega_c t)$ terms can be dropped given that these will be removed by the receiver anyways).

The final stage to model is the PA. The input to the PA can be rewritten in polar notation as $$\hat{y}(t)=r(t)\cos[\omega_c t+\omega(t)]$$

where r(t) is the modulated envelope (derived in appendix) and $\omega(t)$ is the modulated phase, given as $$r(t)=\text{sign}[\hat{y}_1(t)]\sqrt{\hat{y}_1^2(t)+\hat{y}_Q^2(t)}$$

and $$\omega(t)=\tan^{-1}[\hat{y}_Q(t)/\hat{y}_1(t)]$$

where the $\text{sign}[\hat{y}_1(t)]$ term in the magnitude accounts for the 180° phase invariance of the inverse tangent function. This sign term can be removed if a four-quadrant tangent function is used instead.

The standard method for modeling a PA consists of two components, an AM-to-AM conversion $A[r(t)]$ and an AM-to-PM conversion $\Phi[r(t)]$ such that the PA output is $$z_{RF}(t)=A[r(t)]\cos(\omega_c t+\omega(t)+\Phi[r(t)])$$

See, A. A. M Saleh, "Frequency-independent and frequency dependent nonlinear models of TWT amplifiers," *IEEE Trans. Commun.*, Vol. 29, No. 11, pp. 1715–1720, November 1981. As before, this can be manipulated into the following form $$z_{RF}(t) = A[r(t)]\cos\{\psi(t) + \Phi[r(t)]\}\cos(\omega_c t) -$$
$$A[r(t)]\sin\{\psi(t) + \Phi[r(t)]\}\sin(\omega_c t)$$
$$= z_I(t)\cos(\omega_c t) - z_Q(t)\sin(\omega_c t)$$

where $$z_1(t)=A[r(t)]\cos\{\omega(t)+\Phi[r(t)]\}$$

and $$z_Q(t)=A[r(t)]\sin\{\omega(t)+\Phi[r(t)]\}$$

represent the baseband model of the PA (i.e. the complex envelope). These equations are used to model the 802.11a transmitter for the purposes of evaluating the effects of the PA and for optimizing the predistorter and determining its performance.

Amplitude Distribution and Peak-to-Average Ratio

In order to model the PA and design the predistorter, it is important to understand the characteristics of the input signals to each. Of particular interest are two density functions. The probability density function (pdf): the pdf of a random process x(t) indicates the relative frequency of occurrence, or probability, of any fixed value of x. The cumulative density function (cdf): the cdf is defined as Prob[x(k)≤x]—i.e. the probability that at some instant k, the value of the random process x(t) is less than a particular fixed value of x. The peak-to-average ratio (PAR) or crest factor (CF) is defined as the ratio of the absolute peak amplitude to the average absolute amplitude. The peak-to-average power ratio (PAPR) is the ratio of the peak power to the average power. These signal characteristics are important in determining the effects of clipping and quantization.

In-Phase and Quadrature Components—Theoretical

The amplitude of the in-phase and quadrature components of x(t) prior to the predistortion block approximates a Gaussian random process according to the central limit theorem. The pdf of $x_I(t)$ and $X_Q(t)$ can thus be approximated by the Gaussian pdf with zero mean $$p(x) = \left(\sigma_x \sqrt{2\pi}\right)^{-1} e^{\frac{x^2}{2\sigma_x^2}}$$

where $\sigma_x$ is the variance of x computed as the square root of $E[x^2]$ where $E[.]$ is the expectation (averaging) operator. Here, $E[x^2]$ is also the average energy of x(t). Therefore, the variance of $x_I(t)$ and $X_Q(t)$ is $$\sigma_x = \sqrt{E[x^2]} = \sqrt{\left(\frac{1}{2}\right)\left(\frac{52}{64}\right)\left(\frac{1}{64}\right)} = 0.07967217989989$$

where the ½ term is due to half the power being in the in-phase branch and half being in the quadrature branch, the 52/64 term represents the ratio of unity energy carriers (48 data+4 pilot) to total available carriers (64), and the 1/64 term represents the IFFT scaling. The average signal energy of $x_I(t)$ and $X_Q(t)$ is then $$E[x^2] = \sigma_x^2 = 0.00634765625.$$

Continuing the approximation of $x_I(t)$ and $x_Q(t)$ as Gaussian processes, the cdf of these functions can be approximated as $$F(x) = 1 - \frac{1}{2} erfc\left(\frac{x}{\sqrt{2}\sigma_x}\right) \text{ where } erfc(x) = \frac{2}{\sqrt{\pi}} \int_x^\infty e^{-t^2} dt.$$

erfc(.) denotes the complimentary error function, which is available as a built-in function in the Matlab simulation and development environment.

Finally, the average absolute amplitude (required to compute the CF), can be estimated as (assuming a Gaussian pdf)

$$E[|x|] = 2\int_0^\infty |x|p(x)dx = \frac{2}{\sigma_x\sqrt{2\pi}}\int_0^\infty xe^{-x^2/2\sigma_x^2}dx = \sigma_x\sqrt{\frac{2}{\pi}}.$$

Thus, given a, computed above, the average absolute amplitude is $$E[|x|] = 0.06356920226763.$$

A Gaussian random variable has a non-zero probability of taking any value from $-\infty$ to $+\infty$ and thus has an infinite CF. This is where the Gaussian approximation of $x_I(t)$ and $x_Q(t)$ breaks down, given that $x_I(t)$ and $x_Q(t)$ do have finite limits. The theoretical maximum peak values for x(t) are derived in the appendix. Using these results, the peak values (referenced to $\sigma_x$) and the crest factors (peak divided by average) are determined and set forth in the following table:

| Constellation | Peak | Crest Factor |
|---|---|---|
| BPSK | | |
| $x_I(t)$ | 10.2 $\sigma_x$ | 12.781346 |
| $x_Q(t)$ | 7.4 $\sigma_x$ | 9.299902 |
| QPSK | 9.3 $\sigma_x$ | 11.656908 |
| 16-QAM | 12.5 $\sigma_x$ | 15.639383 |
| 64-QAM | 14.2 $\sigma_x$ | 17.806221 |

From the table and the maximum acceptable quantization and clipping noise, the fixed point representation requirements can be determined, as discussed below in the context of implementing the predistorter.

Baseband Signal Envelope—Theoretical

The envelope of the baseband transmit signal is $$\rho(t) = \sqrt{x_I^{2(t)} + x_Q^{2(t)}}.$$

Given that $x_I(t)$ and $x_Q(t)$ are approximately Gaussian, $\rho(t)$ can be modeled as a Raleigh random process. Thus, the pdf and cdf of $\rho(t)$ can be approximated as $$p(\rho) = \frac{\rho}{\sigma_x^2} e^{\frac{\rho^2}{2\sigma_x^2}} \text{ and } F(\rho) = 1 - e^{\frac{\rho^2}{2\sigma_x^2}}.$$

Furthermore, the average absolute amplitude of the envelope is $$E[|\rho|] = \int_0^\infty \rho p(\rho) d\rho = \frac{1}{\sigma_x^2} \int_0^\infty \rho^2 e^{-\rho^2/2\sigma_x^2} d\rho = \sigma_x \sqrt{\frac{\pi}{2}}$$

which, given $\sigma_x$ computed above, is $$E[|\rho|] = 0.09985426941927.$$

Finally, the average energy of $\rho(t)$ is simply the sum of the energy in the in-phase and quadrature paths, or $$E[\rho^2] = 2\sigma_x^2 = 0.01269531250.$$

The theoretical maximum peak values for $\rho(t)$ are derived in the appendix. Using these results, the peak values (referenced to the square-root of the energy, $\sqrt{2}\sigma_x$) and the peak to average power ratio (PAPR) for $\rho(t)$ are determined in the following table:

| Constellation | Peak | PAPR |
|---|---|---|
| BPSK | 7.2√2 $\sigma_x$ | 17.2 dB |
| QPSK | 5.8√2 $\sigma_x$ | 15.2 dB |
| 16-QAM | 7.7√2 $\sigma_x$ | 17.7 dB |
| 64-QAM | 8.8√2 $\sigma_x$ | 18.9 dB |

These results determine the fixed-point representation requirements for the predistorter.

Simulation

The OFDM system of FIG. 1 was simulated up to the pre-distorter input. An oversampling rate of 4 was used and the windowing length was set to 1/80 of the OFDM symbol period. The $|x_I(t)|$, $|x_Q(t)|$ and $\rho(t)$ signals were histogrammed into 100 bins each. The results from the $|x_I(t)|$ and $|X_Q(t)|$ signals, which have identical distributions, were averaged to get a composite result, $|x_{1,Q}(t)|$.

Figure 2:
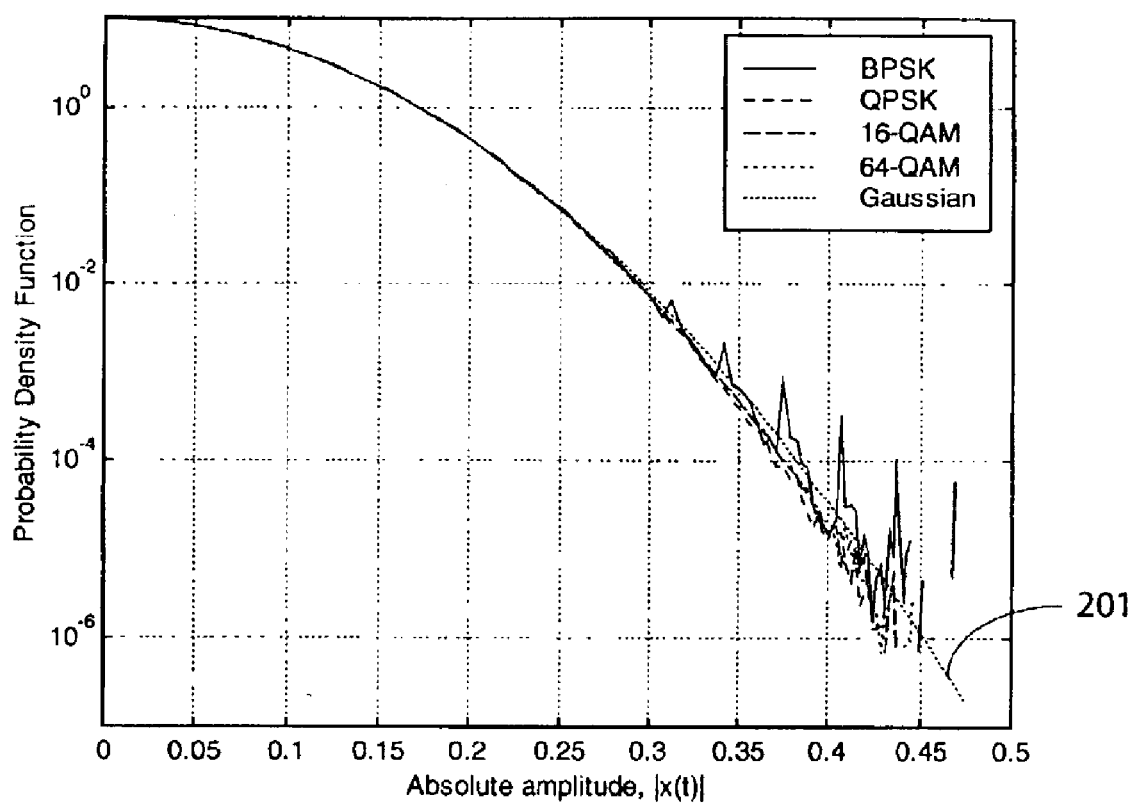
FIG. 2 shows simulated probability distribution functions for the magnitude of real and imaginary signal components over time of various constellations.
Figure 3:
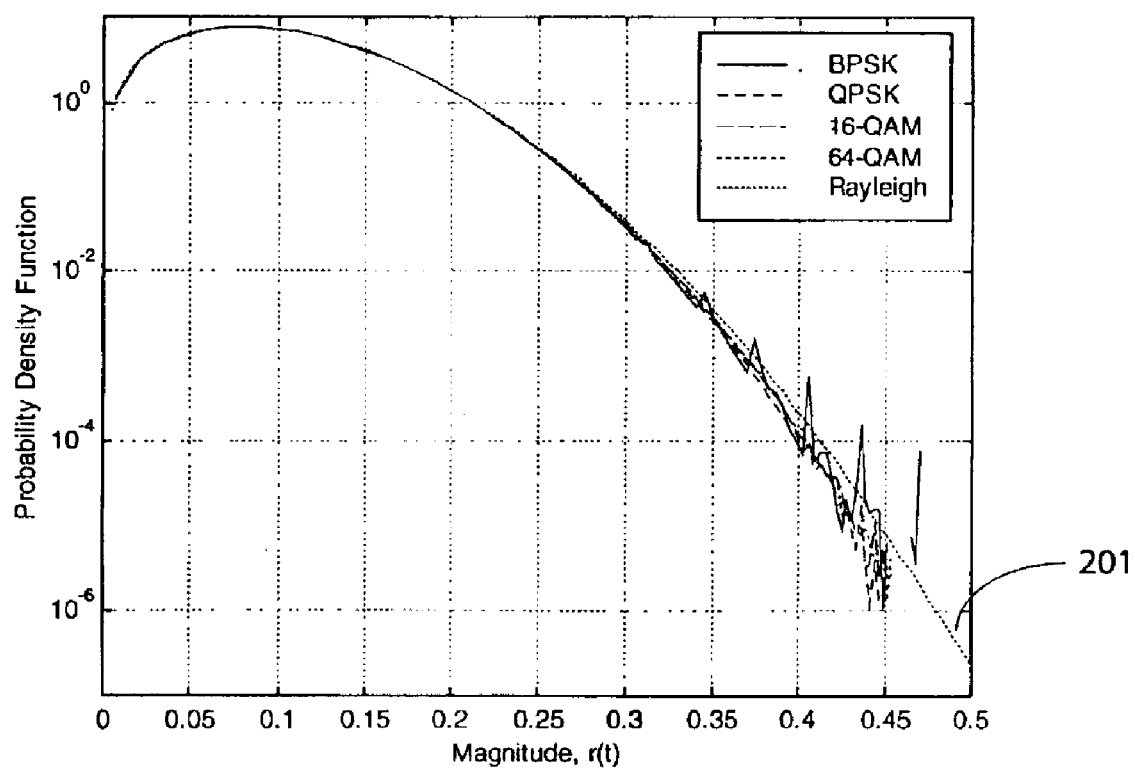
FIG. 3 illustrates similar results for power over time.

FIG. 2 shows the simulated pdfs of $|x_{1,Q}(t)|$ for the BPSK, QPSK, 16-QAM and 64-QAM constellations. The dashed line 201 represents the theoretical pdf derived above. As expected, theory matches at lower amplitudes but because of the finite range of $x_1(t)$ and $X_Q(t)$, the actual pdfs drop toward zero for larger amplitudes. FIG. 3 illustrates similar results for p(t).

Figure 4:
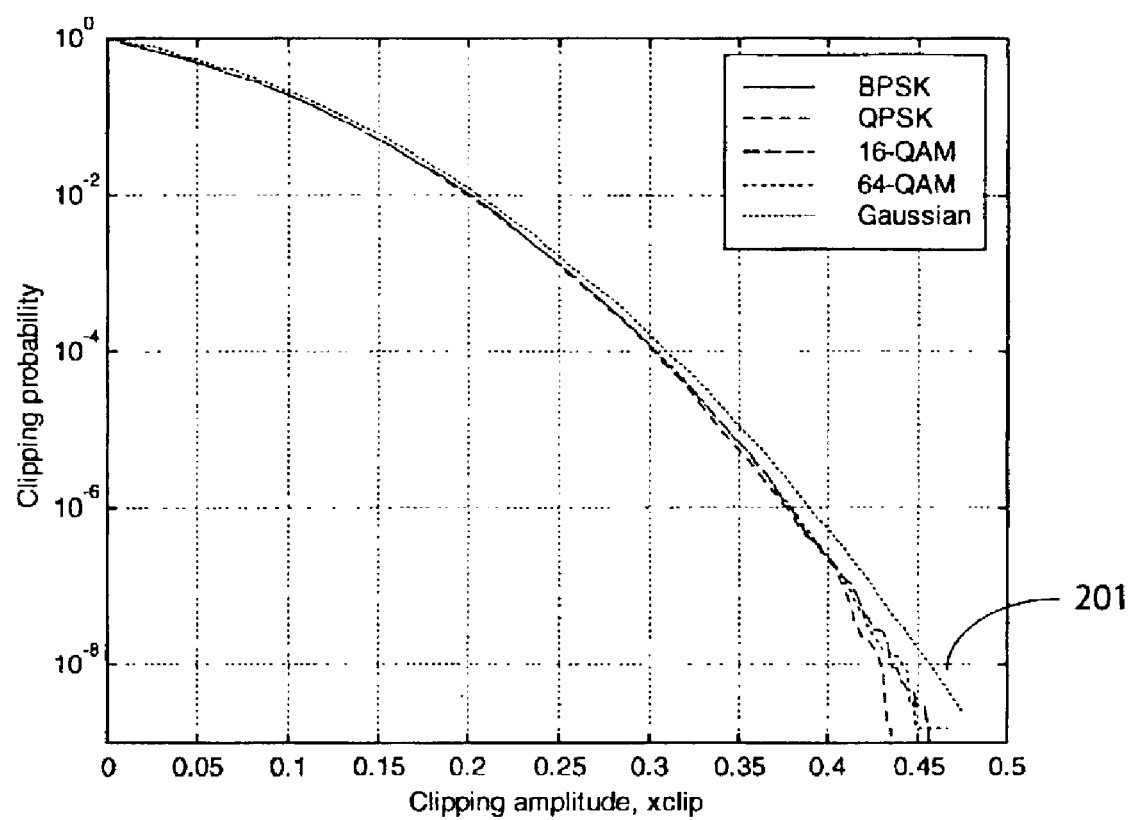
FIG. 4 shows the probability of clipping real and imaginary components of symbols.

FIG. 4 shows the probability of clipping $x_1(t)$ and $X_Q(t)$ as a function of the clipping amplitude for the BPSK, QPSK, 16-QAM and 64-QAM constellations. This is a straight forward interpretation of the cdf, F(x), where $$P_{clip} = \text{Prob}[|x(t)| > x_{clip}] = 1 - \text{Prob}[|x(t)| \le x_{clip}] = 1 - F(x_{clip}).$$

Figure 5:
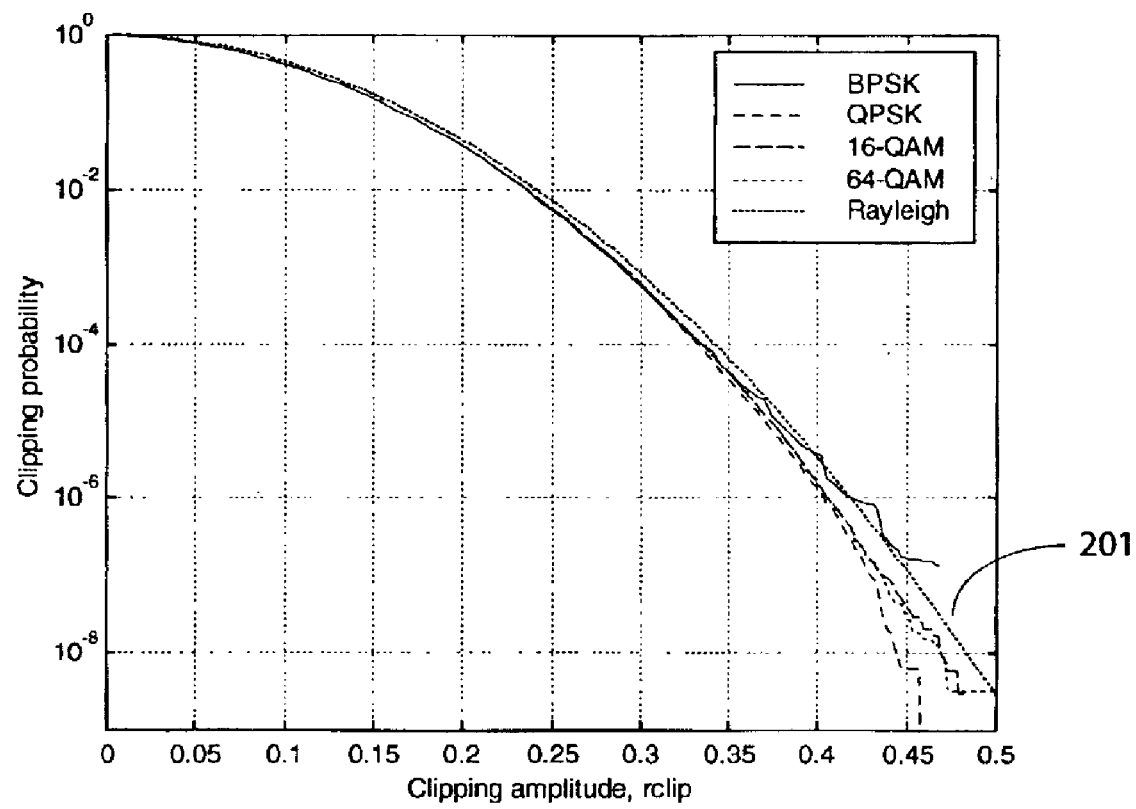
FIG. 5 illustrates similar results for clipping of power.

The dashed line represents the theoretical probability of clipping using the cdf derived above. Again theory matches at the lower amplitudes but not at the higher amplitudes as expected. FIG. 5 illustrates similar results for p(t).

The table below lists the clipping statistics for several clipping probabilities for x(t).

|  | BPSK | QPSK | 16-QAM | 64-QAM |
| --- | --- | --- | --- | --- |
| Number of OFDM Symbols Simulated | 1,287,100 | 1,035,200 | 1,056,400 | 1,003,600 |
| $x_{clip}$ at $P_{clip} = 10^{-2}$ | 0.2003 | 0.1997 | 0.2000 | 0.2000 |
| $x_{clip}$ at $P_{clip} = 10^{-3}$ | 0.2570 | 0.2553 | 0.2562 | 0.2564 |
| $x_{clip}$ at $P_{clip} = 10^{-4}$ | 0.3084 | 0.3012 | 0.3028 | 0.3032 |
| $x_{clip}$ at $P_{clip} = 10^{-5}$ | 0.3547 | 0.3401 | 0.3433 | 0.3436 |
| $x_{clip}$ at $P_{clip} = 10^{-6}$ | 0.4054 | 0.3765 | 0.3787 | 0.3794 |
| $x_{clip}$ at $P_{clip} = 10^{-7}$ | 0.4425 | 0.4081 | 0.4127 | 0.4102 |

The table below lists similar statistics for ρ(t).

|  | BPSK | QPSK | 16-QAM | 64-QAM |
| --- | --- | --- | --- | --- |
| Number of OFDM Symbols Simulated | 1,287,100 | 1,035,200 | 1,056,400 | 1,003,600 |
| $\rho_{clip}$ at $P_{clip} = 10^{-2}$ | 0.2355 | 0.2358 | 0.2362 | 0.2363 |
| $\rho_{clip}$ at $P_{clip} = 10^{-3}$ | 0.2882 | 0.2885 | 0.2896 | 0.2898 |
| $\rho_{clip}$ at $P_{clip} = 10^{-4}$ | 0.3349 | 0.3319 | 0.3340 | 0.3345 |
| $\rho_{clip}$ at $P_{clip} = 10^{-5}$ | 0.3765 | 0.3697 | 0.3730 | 0.3732 |
| $\rho_{clip}$ at $P_{clip} = 10^{-6}$ | 0.4184 | 0.4035 | 0.4061 | 0.4061 |
| $\rho_{clip}$ at $P_{clip} = 10^{-7}$ | N/A | 0.4299 | 0.4372 | 0.4358 |

Several observations can be made from this data. The variations in clipping probabilities as a function of the constellation size are very small, allowing a single value to be used as an approximation, independent of constellation size. The probability of clipping ρ(t) is only marginally larger than that of $x_1(t)$ or $x_Q(t)$ although theoretically, the maximum ρ(t) is $\sqrt{2}$ times larger than either $x_1(t)$ or $x_Q(t)$. This is attributed to the very small probability that both $x_1(t)$ and $x_Q(t)$ are simultaneously very large. The peak values as derived above exceeded any peak values seen here. Although not all possible combinations were tested, this is a testament to the rarity of a peak occurring.

Power Amplifier Modeling

In order to simulate the effects of the PA and to design an optimum pre-distortion filter, suitable PA models are required. The approach here is to (i) collect common PA models from literature, (ii) to measure actual PA's using a two-port network analyzer and finally, (iii) develop a procedure for characterizing PA's in a production environment using the 802.11a transmitter as a signal source. For simulation using PA measurements, a cubic spline is used to interpolate between measured values.

The following nomenclature has been defined:

$$\hat{y}(t) = r(t)\cos[\omega_c t + \Psi(t)] \text{ and}$$

$$z_{RF}(t) = A[r(t)]\cos(\omega_c t + \Psi(t) + \psi(t) + \Phi[r(t)])$$

where $\hat{y}(t)$ is the real-valued input signal to the PA, r(t) represents the modulated envelope, Ψ(t) represents the modulated phase, $\omega_c$ is the carrier frequency, A[r(t)] and Φ[r(t)] model the AM-to-AM and AM-to-PM distortion and finally, $z_{RF}(t)$ is the real-valued PA output signal at RF.

The following notation is used for describing the PA's general characteristics: $P_{sat}$: The maximum output power or saturation point of the PA. $P_{1dB}$: The PA's output power at which point the PA's gain is reduced by 1 dB from that in the linear region (much easier to measure in real life than $P_{sat}$). $P_{BO}$: The reduction in average PA output power relative to $P_{sat}$ (or equivalently from $P_{1dB}$) used to control the percentage of time the PA is in or near saturation.

To simplify analysis, the models (both from literature and measured) have been normalized such that $P_{sat}$ is unity and the minimum input amplitude at which saturation occurs is also unity. This is equivalent to dividing the PA into a non-linear portion and a linear portion, where the predistorter only compensates for the non-linear portion. The gain of the linear portion of the PA is the ratio of the actual saturation amplitude to the minimum input amplitude required to saturate the PA. By normalizing the PA models, $P_{sat}$ becomes unity or 0 dB. The actual saturation power is thus equal to the gain of the linear portion of the PA.

General Models from Literature

Several PA models have been developed to characterize either the AM-to-AM or the AM-to-AM and AM-to-PM distortion. The following basic PA model characterizes only the AM-to-AM distortion due to the $3^{rd}$ harmonic only using a cubic nonlinearity.

$$z_{RF}(t) = \alpha_1 \hat{y}_{RF}(t) + \alpha_3 (\hat{y}_{RF}(t))^3 \text{ for } |\hat{y}| \le \hat{y}_{sat} = \sqrt{\alpha_1/3\alpha_3}$$

where $\hat{y}_{RF}(t)$ is the input to the PA (output from the mixer), $z_{RF}(t)$ is the output of the PA, $\alpha_1$ represents the linear gain of the PA and $\alpha_3$ represents the strength of the $3^{rd}$ order distortion product. This PA model can be represented in the baseband model using $$A[r] = \left(r\alpha_1 - \frac{3\alpha_3}{4}r^3\right) \text{ and } \Phi[r] = 0.$$

The following table lists several more advanced PA models along with their parameters.

| Model | A(r) | Φ(r) | Parameters | | |
|---|---|---|---|---|---|
| Saleh | $\dfrac{\alpha_o r}{1+\beta_a r^2}$ | $\dfrac{\alpha_\phi r^2}{1+\beta_\phi r^2}$ | TWT: | | |
| | | | $\alpha_a = 2.1587$ | $\beta_a = 1.1517$ | |
| | | | $\alpha_\phi = 4.0330$ | $\beta_\phi = 9.1040$ | |
| | | | Simplified TWT: | | |
| | | | $\alpha_a = 2$ | $\beta_a = 1$ | |
| | | | $\alpha_\phi = 2\pi/6$ | $\beta_\phi = 1$ | |
| Ghorbani | $\dfrac{x_1 r^{x_2}}{1+x_3 r^{x_2}}+x_4 r$ | $\dfrac{y_1 r^{y_2}}{1+y_3 r^{y_2}}+y_4 r$ | GaAs FET: | | |
| | | | $x_1 = 8.1081$ | $y_1 = 4.6645$ | |
| | | | $x_2 = 1.5413$ | $y_2 = 2.0965$ | |
| | | | $x_3 = 6.5202$ | $y_3 = 10.880$ | |
| | | | $x_4 = -0.0718$ | $y_4 = -0.0030$ | |
| Modified Saleh | $\dfrac{\alpha_a r^2}{1+\beta_a r^2}$ | $\dfrac{\alpha_\phi r^2}{1+\beta_\phi r^2}$ | GaAs FET: | | |
| | | | $\alpha_a = 20.0$ | $\beta_a = 19.5$ | |
| | | | $\alpha_\phi = 5.4514$ | $\beta_\phi = 12.9957$ | |
| Rapp | $\dfrac{r}{\left[1+(|r|/r_{sat})^{2P}\right]^{\frac{1}{2P}}}$ | None | Solid State: none | | |

In most cases, the parameters were found by applying multi-dimensional minimization of the mean squared error of the model against actual PA measurements. In the Modified Saleh case, the parameters were found by minimizing the error between that model and Ghorbani's model. The Saleh model is the most commonly referenced model in literature, even though it was developed for TWT PA's and not the more modern solid state or GaAs PA's. These models appear in: A. Ghorbani, M. Sheikhan, "The effect of solid state power amplifiers (SSPAs) nonlinearities on MPSK and M-QAM signal transmission," *Proc. of the Sixth Int'l Conference on Digital Processing of Signals in Comm.*, 1991, pp. 193–197. D. Falconer, T. Kolze, Y. Leiba, J. Leibetreu, "Proposed system impairment models," *IEEE 802.16 Broadband Wireless Access Working Group*, Doc. No. IEEE 802.11.1.pp-00/15, March 2000. C. Rapp, "Effects of HPA-nonlincarities on a 4-DPSK/OFDM-signal for a digital sound broadcasting system," in *Proc. of the Second European Conference on Satellite Comm.*, Liege, Belgium, Oct. 22–24, 1991, pp. 179–184.

Laboratory Characterization of PA's

Several PA's have been characterized in the laboratory to determine their AM-to-AM and AM-to-PM responses. These measurements are tabulated in FIG. 6. In these measurements, of particular interest are the variability between similar PA makes and models and the variability of PA's to environmental factors such as supply voltage, temperature and time. The ability of the predistorter to compensate for such PA's is addressed below.

Measurement Procedure

Figure 7:
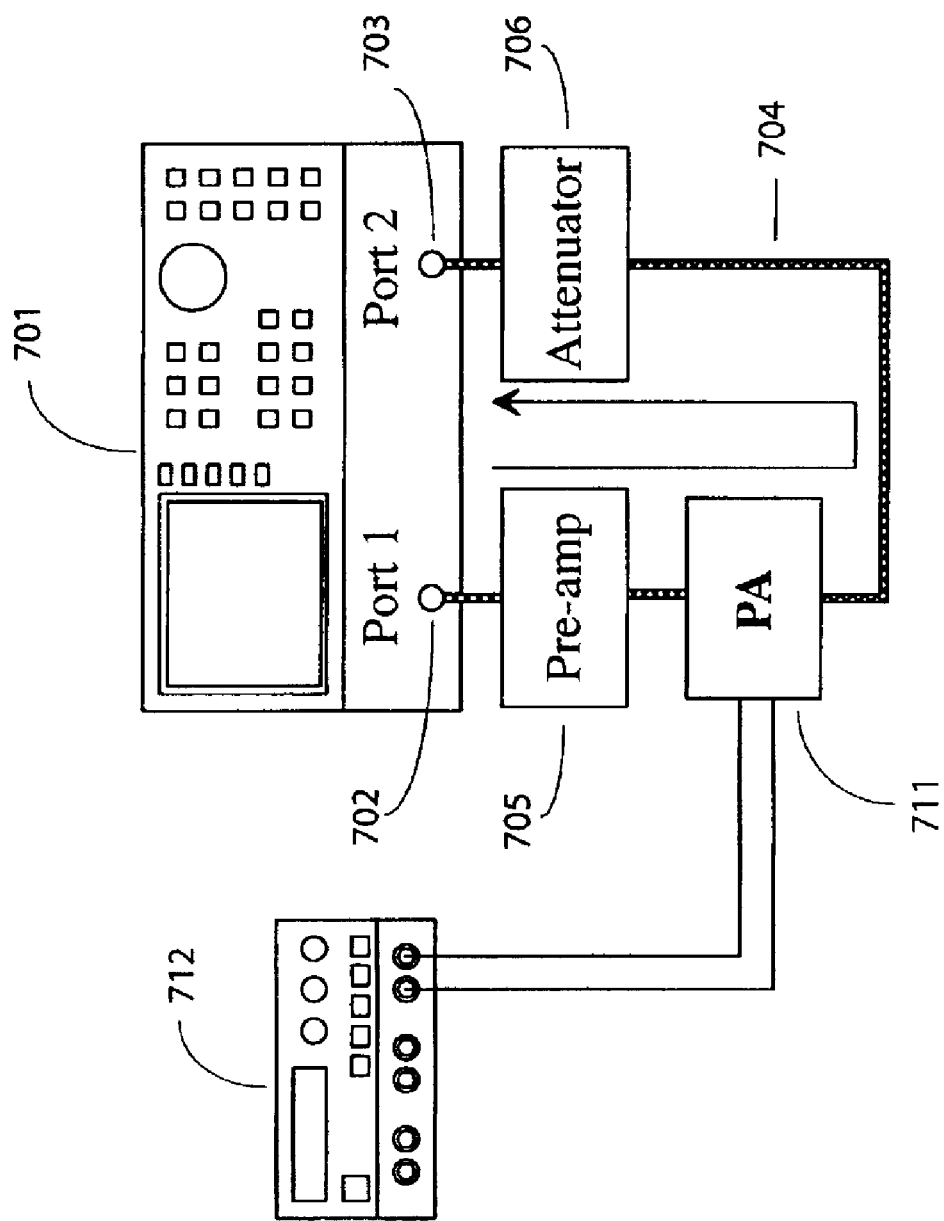
FIG. 7 illustrates a setup for measuring responses of a particular power amplifier.

FIG. 7 illustrates the set-up for measuring the AM-to-AM and AM-to-PM responses of a particular PA. The network analyzer 701, such as an HP 8719ES 50 MHz to 13.5 GHz 5-parameter network analyzer, generates an unmodulated continuous wave signal at Port 1 (702) that repetitively sweeps over the intended operation bandwidth of the PA. A 50W coaxial cable 704 with SMA connectors was used to carry the signal. The PA under test 711 amplifies this signal before being input back into Port 2 (703) of the network analyzer. The network analyzer compares the received signal at Port 2 with the transmitted signal at Port 1 to determine the gain and phase offset incurred between the two ports. An optional pre-amplifier stage 705 may be required at the input of the PA if the output signal from the network analyzer cannot sufficiently drive the PA (the upper limit of the HP analyzer's transmitter is about +11 dBm beyond which its own PA begins to saturate). It is recommended that an attenuator 706 be inserted after the PA such that the network analyzer's receiver is not over-driven. A DC power supply 712 powers the PA 711. This particular network analyzer can be configured for test purposes as follows: Select center frequency according to intended frequency of operation (2.437 GHz for 802.11g and 5.2, 5.3 and 5.775 GHz for 802.11a). Select span according to intended bandwidth of operation (20 MHz for 802.11a). Select direction of signal such that Port 1 is the transmitter and Port 2 is the receiver (measure S21). Configure display to show both the gain and phase responses. Prior to executing any tests, the network analyzer 701 should be calibrated with only the cabling 704 and optional attenuator 706 in place (i.e. remove pre-amp 705 and PA 711). The calibration procedure normalizes the measurements such that the effects of cabling and attenuation are accounted for. Calibration is performed by selecting the calibration button. Once calibration is complete, the optional pre-amplifier and PA may be inserted.

The PA 711 and pre-amplifier 705, if included, are characterized as follows. Select an RF input level that is at least 5 or more dB into the linear region of the PA. Adjust the electrical delay of the network analyzer such that the phase response is as close to flat as possible over the frequency span, adjusting the resolution of the phase display if necessary. Enable averaging for both the gain and phase offset such that they are reasonably stable. Record the average gain and phase offset as measured by the network analyzer at the center frequency point. Ideally, the gain and phase offset should be independent of the frequency (i.e. both responses should be near flat over the entire frequency span. Increase the transmit level by one dB and repeat the measurement outlined in the previous step. Continue this until the PA exceeds saturation—i.e. when the gain decreases by one or more dB when the transmit level is increased by 1 dB.

If a pre-amplifier 705 is used, the pre-amplifier is characterized independently of the PA 711 (i.e. with the PA removed following the above steps) and the pre-amplifier's gain and phase responses must be subtracted from those obtained when both the pre-amplifier and PA were used. Preferably, the pre-amplifier will operate in its linear region and should not be forced to operate beyond its 1 dB compression point.

Characterizing an 802.11a Transmitter's PA

It is not always possible or desirable to use the laboratory procedure described above for characterizing a PA. For example, the PA of a production unit may be characterized in an automated manufacturing environment. Another method of characterizing the PA by transmitting a predetermined OFDM signal and then processing the received signal to determine the PA characteristics is described below.

The signal transmitted through the PA can be derived either by an external analog source fed into the transmit radio or generated by a baseband transmitter. Using an analog source removes timing offset errors between the transmitter and receiver and does not restrict the signal to an 802.11a format. However, it does require access to a test point on the transmitter to inject the training signal and still suffers synchronization issues. Using the baseband transmitter to generate a training signal simplifies the production process. However, it may require a specialized receiver. Given that the receiver processing can be performed off-line, receiver complexity should not be a concern. Using the baseband transmitter to generate the training signal is the preferred method and thus the focus of this discussion.

Figure 8:
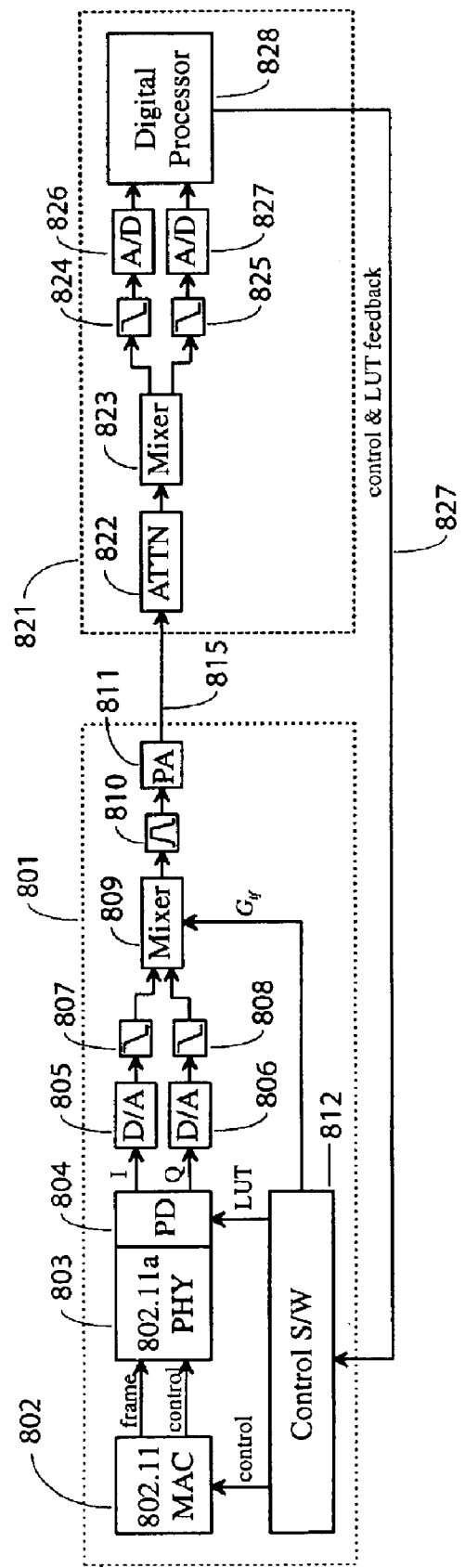
FIG. 8 illustrates an alternative test setup.

FIG. 8 illustrates the alternative test setup. The production device under test 801 is unmodified with the exception of the software required to start the transmission of the predetermined frames used to characterize the PA 811, set the IF gain and program the predistorter lookup table (LUT) 804. A wired channel 815 connects the RF output of the device, under test to a hardware simulation platform 821 substantially eliminating noise, co-channel interference and fading channel effects. The hardware simulation platform (or possibly a modified form of the platform) includes an attenuator 822, a mixer 823, high resolution A/D converters 826 and a digital processor 828. Anti-aliasing filters 824, 825 are located prior to the A/D's. Because of the low noise environment, these filters can be very loose and thus will not impact the signal bandwidth. The digital processor 828 demodulates the received signal, and compares the received signal with the transmitted signal to determine the PA characteristics.

The predistortion algorithms considered in the Predistortion Filtering section assume flat (or near flat) group delay and magnitude characteristics between the predistorter output and the PA input. They also assume that frequency independent AM-to-AM and AM-to-PM PA responses (across each 20 MHz band—other frequency bands may have different frequency responses). Maintaining these assumptions simplifies the characterization process by eliminating filtering effects and frequency dependent PA characterizations. The methods and devices disclosed herein can be extended to address the complications.

The following characteristics of the PA characterization signal are desirable, but not necessarily essential: easily generated by the 802.11a transmitter with little or no additional circuitry; reuse of the 802.11a preamble enabling reuse of synchronization algorithms at the receiver (shortens implementation time); deterministic and thus reproducible at the receiver; large dynamic range at the PA input; short, repeating pattern such that the time to characterize the PA is not fixed; and displays properties useful for measuring gain and phase imbalance.

One transmit signal that can be used for characterizing the PA includes a repeating sequence of 802.11a PLCP frames generated by the MAC. The IF gain, $G_{if}$ would be constant over a single frame but could be changed from frame to frame. For example, a sequence of four PLCP frames with $G_{if}$ equal to 0, 2, 4 and 6 dB each could be repeated indefinitely (or until told to stop by the PA characterization process).

FIG. 110 of the 802.11a PHY standard document illustrates the framing of each PLCP frame. The SHORT and LONG preamble symbols are used to acquire frequency offsets and determine symbol boundaries, the SIGNAL symbol identifies the data rate and length of the DATA field, and the DATA field contains the portion of the transmit signal used for characterizing the PA. It is proposed that the length of the DATA field as noted in the SIGNAL symbol correspond to the characteristics of that particular PLCP frame (i.e., corresponds to $G_{if}$ and/or DATA field content).

For PA characterization, the content of the DATA field is not very important provided that it is deterministic and creates typical OFDM symbols with reasonable magnitude distribution. For PA characterization, any constellation size can be used.

For the purpose of characterizing the PA, the predistorter can be initialized such that it has no effect (equivalent to bypassing the predistorter) or initialized to some predetermined response. The latter optionally allows the magnitude distribution of the PA input signal to be shaped such that a richer transmit signal is obtained (i.e. has a more diverse set of magnitudes).

The receiver is implemented on a programmable simulation platform specifically designed for performing PA characterizations in near real-time. Although good synchronization can be obtained using the frame preamble symbols (particularly in such a high SNR environment), the entire packet may be queued for post processing to further refine synchronization if necessary. Because some constant frequency-independent delay will be introduced, the signal will need to be resampled to align the sampling instants of the transmit and receive signals. Again, this delay can be determined using the preamble and refined during post processing. Once synchronization and phase equalization have been performed, the AM-to-AM and AM-to-PM responses can be determined as a function of the PD input magnitude by comparing the transmit time-domain samples to the received time-domain samples. Repeating these measurements and averaging over time allows the effects of any noise to be mitigated. Furthermore, if various IF gains are used, the exact gain can be determined at the receiver.

Predistortion Filtering

The predistorter (PD) applies a complex linearizing function $\lambda(\rho^2)$ to the baseband digital signal such that the composite response of the PD and PA is approximately linear $$y(t)=\lambda(\rho^2)x(t) \text{ where } \rho^2=x_I^2(t)+x_Q^2(t).$$

The PD is not intended to compensate for other radio effects such as mixer imbalance, but may be extended in implementation to do so.

In order to gain the benefits of the predistortion algorithms described here, without supplemental processing, the group delay and magnitude response between the output of the predistorter and the input to the PA should be reasonably linear. This ensures that the magnitude of the transmit signal at the output of the predistorter is not modified (other than by some constant frequency independent gain factor) prior to being input to the PA. Furthermore, it is assumed that the AM-to-AM and AM-to-PM responses of the PA are to frequency independent. Solutions, where these conditions are not met, are of increased complexity.

Several predistortion algorithms have been used in other contexts, much different from low-cost, 802.11a compliant devices. A&P predistortion independently compensates for amplitude and phase distortion using two real valued polynomials. A. D'Andrea, V. Lottici, R. Reggiannini, "Nonlinear predistortion of OFDM signals over frequency selective fading channels," *IEEE Trans Commun.*, Vol. 49, No. 5, pp. 837–842, May 2001. This algorithm is the least complex of those considered; however, it requires significant computation to train and may not always suitably converge if the PA response is poorly behaved. MMSE predistortion uses a single complex polynomial to remove the PA distortion. M-G Di Benedetto, P. Mandarini, "An application of MMSE predistortion to OFDM systems," *IEEE Trans. Commun.*, Vol. 44, No. 11, pp. 1417–1420, November 1996. Given similar complexity as the A&P predistorter, the MMSE performance is generally worse. Cubic spline predistortion compensates for PA distortion using a lookup table and cubic spline interpolation between points to approximate $\lambda(\rho^2)$. F. Zavosh, M. Thomas, C. Throu, T. Hall, D. Artasi, D. Anderson, D. Ngo, and D. Runton, "Digital Predistortion Techniques for RF and Power Amplifiers with CDMA Applications," *Microwave Jud.*, October 1999; F. Zavosh, D. Runton and C. Throu, "Digital Predistortion Linearizes CDMA LDMOS Amps," *Microwave & RF*, pp. 55–61 & 164, March 2000. Although more complex than the A&P algorithm, its performance is near optimal.

Two supplementary techniques have been proposed which, when combined with any of the predistortion algorithms above, would further compensate for the PA. Peak-to-average ratio (PAR) reduction techniques reduce the dynamic range of the x(t) signal (see FIG. 1), in order to reduce the probability of the PA clipping and thus reduce clipping noise. This study shows that for a power backoff less than 13 dB, clipping will result, even with a perfect predistorter. PAR reduction techniques may be combined with methods and devices described herein. Another technique, constant peak-power OFDM, scales each OFDM symbol such that the peak power of that OFDM symbol is equal to a fixed peak power level constant for all OFDM symbols. The fixed peak power level is set to the saturation level of the PA to eliminate clipping. This results in a reduced SNR at the receiver for OFDM symbols with otherwise high PAR; however, it is claimed that this loss of SNR is more than compensated for by the elimination of clipping noise. This technique is not 802.11a compliant and has other problems.

The following discussion describes the predistortion schemes, the training and configuration for each (given a known PA response), and propose an implementation for each. In addition, the ideal PD/PA response is developed as a benchmark for training and evaluating each of the predistortion schemes.

Ideal PD/PA Response

The goal of predistortion is to modify the baseband signal such that the output of the PA is linearly proportional to the PD input up to the saturation point of the PA. Beyond the saturation point of the PA the signal clips; thus, the goal is to minimize the error up to the saturation point. In A. D'Andrea, op.cit., the following is given as the ideal response of the PD/PA pair $$z_{ideal}(t) = \begin{cases} x(t) & |x(t)| < 1 \\ x(t)/|x(t)| & |x(t)| > 1 \end{cases}$$

where the PA response is normalized to unity (i.e., the output of the PA saturates at unity and the minimum input level at which the PA saturates is also unity). This ideal response corresponds to hard clipping of the transmit signal magnitude with no phase distortion (the clipping can be viewed as the equal scaling of $x_1(t)$ and $x_Q(t)$ such that the magnitude of x(t) is forced to unity).

Figure 9:
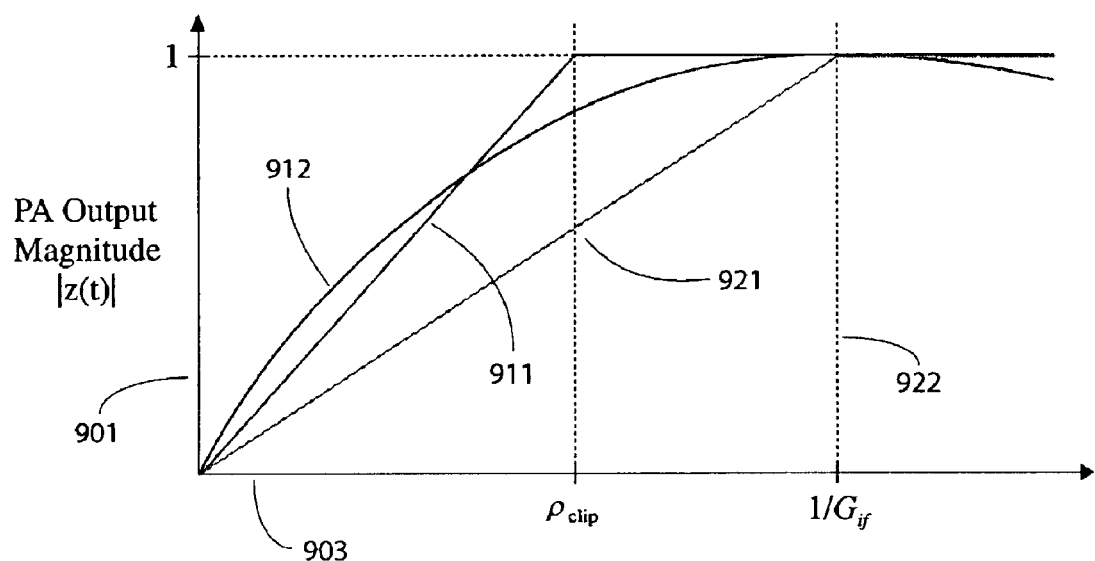
FIG. 9 illustrates ideal and actual responses of a power amplifier.

Ideal and actual responses of a PA are illustrated in FIG. 9. Unfortunately, if the above ideal response 921 (without PD) were used to train the PD, the resulting PD/PA pair would suffer a loss in signal power as compared to the PA alone. This is due to the non-linearity of the PA gain 912, and in particular, the gradual roll-off of the PA gain as it approaches saturation 922. In FIG. 9, the PA output magnitude |z(t)| is plotted against the y-axis 901. The PD input magnitude, r is plotted against the x-axis 903. Power loss due to the inclusion of predistortion is considered unacceptable. Thus, the ideal response provides a gain that ensures that the average signal energy both with and without PD is equal $$z_{ideal}(t) = \begin{cases} x(t)/\rho_{clip} & |x(t)| < \rho_{clip} \\ x(t)/|x(t)| & |x(t)| > \rho_{clip} \end{cases}$$

where $\rho_{clip}$ (921) is the clipping level of the input signal and $1/\rho_{clip}$ is the slope of the ideal linear response in the non-clipping region.

The value $\rho_{clip}$ is computed as follows. The mean squared error (difference) between the signal energy with ideal predistortion and without any predistortion can be written as $$S_{mse} = E[|z_{ideal}(t)|^2] - E[|z_0(t)|^2]$$

where $z_0(t)$ is the PA output when PD is disabled. Given a significantly rich input signal x(k) (i.e. rich implies that it spans the entire expected range of x(t) with sufficiently small resolution), this can be expressed as $$S_{mse} = E[|z_{ideal}(x(k))|^2 p(r(k))] - E[|z_0(x(k))|^2 p(r(k))]$$

$$= \frac{1}{L}\sum_{k=0}^{L-1}[|z_{ideal}(x(k))|^2 - |z_0(x(k))|^2]p(r(k))$$

where p(r(k)) is the pdf of r(k)=|x(k)| and L is the length of x(k). Substituting in $z_{ideal}(t)$ $$S_{mse} = \frac{1}{L}\left\{\sum_{k_1=0}^{L_1-1}\left[\left|\frac{x(k_1)}{\rho_{clip}}\right|^2 - |z_0(x(k_1))|^2\right]p(r(k_1))\bigg|_{r(k)<\rho_{clip}} + \sum_{k_2=0}^{L_2-1}[1-|z_0(x(k_1))|^2]p(r(k_2))\bigg|_{r(k)\geq\rho_{clip}}\right\}$$

where $L_1$ is the number of samples for which r(k)=|x(k)| $<\rho_{clip}$ and $L_2$ is the number of samples for which r(k)=|x(k)| $\leq\rho_{clip}$. By minimizing $S_{msc}$ as a function of $\rho_{clip}$, the optimum $\rho_{clip}$ can be determined. This minimization assumes that the magnitude of x(k) increases uniformly from ~0 to $r_{max}$: i.e. $|x_{tr}(k)|=kr_{max}/L_{tr}$ for k=1, 2, ..., $L_{tr}$ where $L_{tr}$ is the length, in samples, of x(k) (if x(k) does not increase linearly or points are repeated, then a more complex weighting function must replace p(r(k)) above). From FIG. 5, it can be seen that $r_{max}$=0.45 is reasonable. The training signal used for the Matlab simulations is $$x_{1r}(k)=kr_{max}/L_{tr} \cdot e^{-j\theta(k)} \text{ for } k=0, 1, \ldots, L_{tr},$$

where the phase θ(k) has no effect on the PD training and thus was set to zero. $\rho_{clip}$ is a significant starting point: Setting $r_{clip}=\rho_{clip}$, the probability of the PA clipping can be determined from the graph figures and the tables above. The gain between the PD input and normalized PA output including the D/A's, mixer and $G_{if}$ is equal to $1/\rho_{clip}$. The PBO (power back-off—defined as the ratio of the PA's saturation power to the actual transmitted average signal power) is equal to $$P_{BO} = \frac{\text{saturation power}}{PD \text{ input power}/p_{clip}^2} = \frac{\rho_{clip}^2}{2\sigma_x^2}$$

where $\sigma_x^2$ is as defined above and the saturation power is normalized to unity. Note that the PBO value is just the inverse of the transmit power at the output of the PA.

Finally, to ensure no clipping, $\rho_{clip}$ must be greater than 0.5 (the maximum ρ as seen from FIG. 5) which implies the minimum PBO must be greater than about 13 dB—independent of what PA is used. Note that this does not imply that with 13 dB PBO that the signal will be undistorted, it will still suffer from any PA non-linearities. Of course, if perfect PD were employed, the signal would be undistorted.

Clipping and Quantization Effects

Quantization and clipping introduce noise into the transmit signal and impact the gain seen by applying predistortion. This impacts how predistortion is applied. Quantization and clipping are due to the limited precision of the fixed point implementation architecture or the precision of the chosen data representation. Quantization is caused by rounding the least-significant bits whereas clipping is caused by the truncation of the most-significant bits.

For this analysis, both the I and the Q components of the predistorter's input and output signals are quantized by forcing their representation to $b_{in}$ and $b_{out}$ bits, respectively. Clipping has two forms: (i) clipping the individual I and Q samples at both the predistorter input (or equivalently, IFFT output) and predistorter output (or equivalently, at the DAC); and, (ii) clipping the magnitude of the samples by the predistorter. For OFDM, clipping in the transmitter can be introduced at the output of the IFFT and by the predistorter.

A&P Predistortion Scheme

Figure 10:
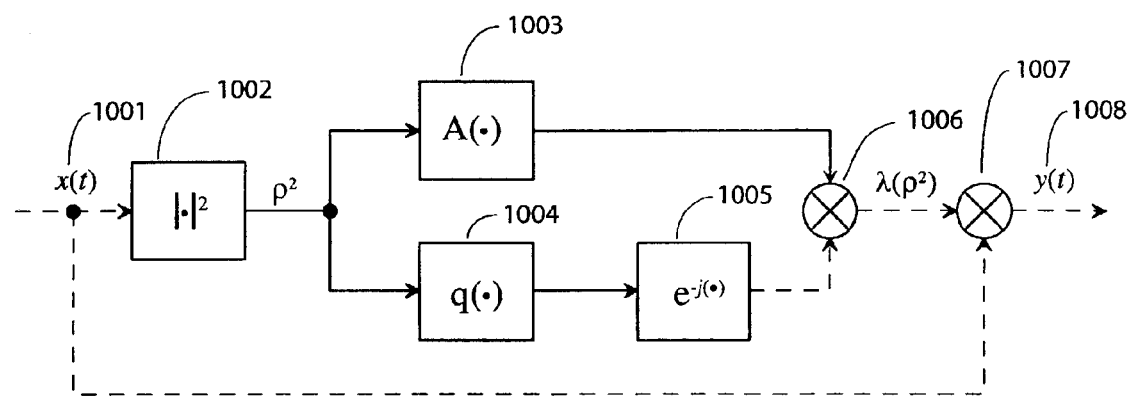
FIG. 10 is a block diagram of a predistorter.

FIG. 10 provides a functional block diagram of the A&P predistorter. Dashed lines in the figure indicate complex values. Mathematically, the A&P PD can be described as $$y(t)=x(t)[A(\rho^2)e^{-j\theta(\rho^2)}] \text{ such that } \lambda(\rho^2)=e^{-j\theta(\rho^2)}.$$

The ideal linearizing functions $A(\rho^2)$ and $\theta(\rho^2)$ are approximated as polynomials in $\rho^2$ of orders $N_A$ and $N_\theta$ respectively, as follows $$\hat{A}(\rho^2) = \sum_{i=0}^{N_A} \beta_i \rho^{2i} \text{ and } \hat{\theta}(\rho^2) = \sum_{i=0}^{N_\theta} \gamma_i \rho^{2i}$$

where the β, and γ, are real-valued coefficients to be determined through training. The exponential function is implemented as a truncated Taylor series expansion of order $N_c$ as follows $$e^{-j\theta(\rho^2)} \approx \sum_{n=0}^{N_e} \frac{[-j\theta(\rho^2)]^n}{n!} = 1 - j\theta(\rho^2) + \frac{[\theta(\rho^2)]^2}{2} - \frac{j[\theta(\rho^2)]^3}{6} + \ldots + \frac{[-j\theta(\rho^2)]^{N_e}}{N_e!}$$

Thus, FIG. 10 is a general block diagram of a predistorter. Complex values are indicated by dotted lines. The complex initial value x(t) is squared to produce a power magnitude $\rho^2$ 1002 and also is routed to the mixer 1007. The power magnitude is separately processed by components 1003, 1004. Component 1003 models the AM to AM correction using the $A(\rho^2)$ polynomial. Component 1004 models the AM to PM correction using the $\theta(\rho^2)$ polynomial. The phase component is reconverted into a complex form 1005 and mixed with the real component 1006. The resulting distortion function is applied 1007 to the initial input 1001 to produce a predistorted output 1008. Details of one training and implementation embodiment of the A&P predistorter are presented below.

Training

Figure 11:
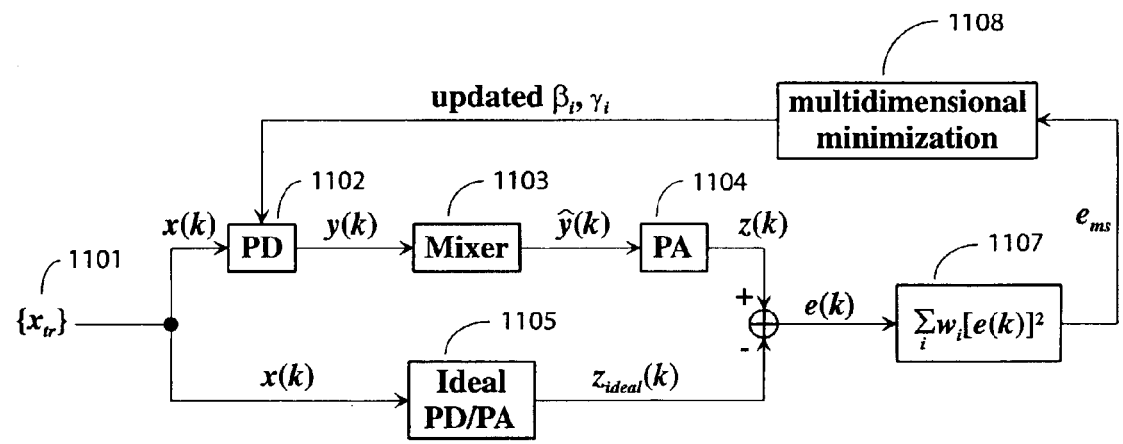
FIG. 11 is block diagram of training a predistorter.

Training the A&P PD includes performing a joint minimization of the mean squared distance between the ideal PD/PA response described above and the actual PD/PA response. The setup is illustrated in FIG. 11 and resembles the training of a single tap adaptive equalizer. A finite length training signal $\{x_{tr}\}$ 1101 is passed through both the ideal PD/PA 1105 and the actual PD/PA 1102-04 using a given set of PD coefficients, $\beta_1$, $\gamma_1$. The error e(k) between the ideal and actual responses is calculated 1106 and squared, weighted by w, and accumulated 1107 to obtain an overall error value $e_{ms}$. This error is passed to the multidimensional minimization block 1108 in order to generate a new set of PD coefficients, $\beta_1$, $\gamma_1$. The process is repeated until either some maximum number of iterations has been reached or the error becomes sufficiently small.

The weighting function, $w_1(k)$, ensures that the mean squared error, e(k) between the ideal and actual responses is weighted such that emphasis is placed on training the PD in the ranges of r(t) that are more prevalent. Assuming that the magnitude of $\{x_{tr}\}$ increases linearly and that r(t) is Rayleigh distributed, $w_1(k)$ should be equal to the Rayleigh pdf evaluated at r(k). If the magnitude of $\{x_{tr}\}$ does not increase linearly, or if points are repeated, then an alternate weighting scheme may be more effective. For the purposes of Matlab simulation, the magnitude of the training signal was defined to increase uniformly from ~0 to $r_{max}$: i.e. $|x_{tr}(k)|=kr_{max}/L_{tr} \cdot e^{-j\theta(k)}$ for k=1, 2, ..., $L_{tr}$ where $L_{tr}$ is the length, in samples, of $\{x_{tr}\}$ such that the Rayleigh distribution could be used as the weighting function. The training signal is $$x_{tr}(k)=kr_{max}/L_{tr} \cdot e^{-j\theta(k)} \text{ for } k=0, 1, \ldots, L_{tr}$$

where the phase θ(k) has no effect on the PD training and thus was set to zero.

Matlab includes the fmins built-in function, which performs multidimensional minimization using the downhill simplex method of Nelder and Mead. Although not very efficient in terms of the number of function evaluations, it is easy to use and the alternative is implementing some other algorithm. This may be preferred if the convergence time of the simplex method is long.

Implementation

The complexity of this solution depends on $N_A$, $N_\theta$ and $N_c$, and should be no greater than $$N_{multiplies} = \overline{2 + \max(N_A, N_\theta) - 1}^{\rho^2, \rho^{2i} \text{ terms}} + \overline{N_A + N_\theta}^{A(\rho^2), \theta(\rho^2) \text{ terms}} + \overline{2(N_e - 1)}^{e^{-j\theta(\rho^2)} \text{ term}} + 2 + 4$$

$$= 5 + N_A + N_\theta + \max(N_A, N_\theta) + 2N_e$$

$$N_{additions} = 1 + \overline{N_A + N_\theta}^{A(\rho^2), \theta(\rho^2) \text{ terms}} + \overline{N_e + 1}^{e^{-j\theta(\rho^2)} \text{ term}} + 2$$

$$= 4 + N_A + N_\theta + N_e$$

Typical values for $N_A$, $N_\theta$ and $N_c$ are {1,1,2} requiring real 10 multiplies and 8 additions per transmitted sample. Of course, this is simplified in that it does not address quantization.

The $A(\rho^2)$ and $\theta(\rho^2)$ polynomials are straightforward to implement. The Taylor series can be rewritten in the more general polynomial form as $$e^{-j\theta} = \sum_{n=0}^{N_e} a_n(-j\theta)^n$$

where the coefficients are $\alpha_n = 1, 1, \frac{1}{2}, \ldots, 1/N_c!$. A slightly more optimal approximation can be found through a multi-dimensional minimization (of mean squared error) that exploits the fact that the Taylor series is truncated. The table below illustrates the optimized coefficients for various $N_c$. Note that as $N_c$ gets larger, the optimized coefficients approach those of the Taylor series. When quantized coefficients are used, this process should be repeated to find the optimal coefficients for that particular quantization level.

| $N_e$ = 2 | $N_e$ = 3 | $N_e$ = 4 |
| --- | --- | --- |
| $a_0$ = 0.99973150559893 | $a_0$ = 0.99972799843853 | $a_0$ = 0.99999925512672 |
| $a_1$ = 0.97239630566387 | $a_1$ = 0.99985405251164 | $a_1$ = 0.99984864575400 |
| $a_2$ = 0.49014143047410 | $a_2$ = 0.49013263736734 | $a_2$ = 0.49993750219504 |
|  | $a_3$ = 0.16413522889682 | $a_3$ = 0.16411366574857 |
|  |  | $a_4$ = 0.04108094701064 |

Cubic Spline Predistortion Scheme

Figure 12:
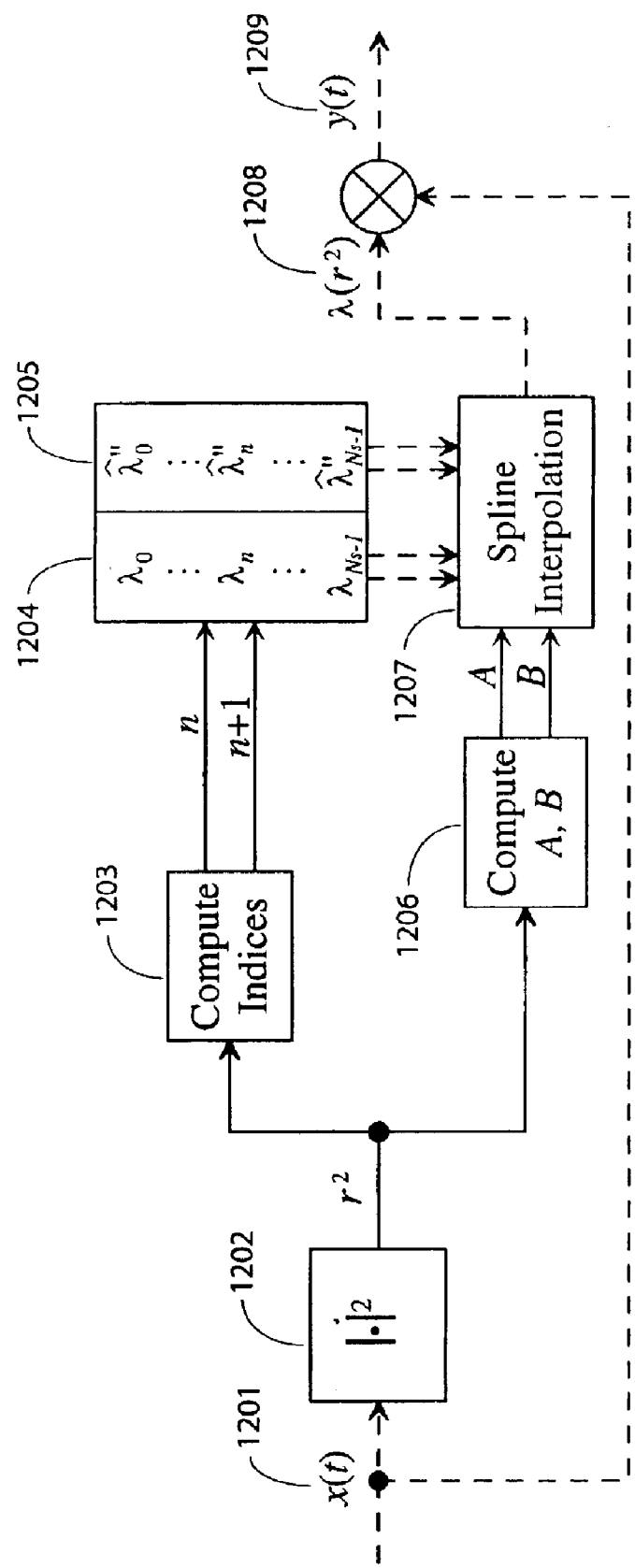
FIG. 12 is a block diagram of a predistorter implementing cubic spline interpolation.

FIG. 12 provides a functional block diagram of a cubic spline predistorter. Dashed lines in the figure indicate complex values. The cubic spline predistorter utilizes two lookup tables 1204, 1205 of $N_s$ complex points each. The first tabulates $\lambda_n$ for $N_s$ values of $\rho_n$ and the second tabulates a scaled version of the second derivative of $\lambda_n$. The second derivative, $\lambda_n''$, is precomputed during training (given $\lambda_n$) by solving the set of $N_s-2$ linear equations $$\frac{\rho_n^2 - \rho_{n-1}^2}{6}\lambda_{m-1}'' + \frac{\rho_{n+1}^2 - \rho_{n-1}^2}{3}\lambda_n'' + \frac{\rho_{n+1}^2 - \rho_n^2}{6}\lambda_{n+1}'' = \frac{\lambda_{n+1} - \lambda_n}{\rho_{n+1}^2 - \rho_n^2} - \frac{\lambda_n - \lambda_{n-1}}{\rho_n^2 - \rho_{n-1}^2}$$

for $n=2, 3, \ldots, N, -1$. The final two equations required to obtain a unique solution for the full set of $\lambda_n''$ are obtained by solving the following equation for $\lambda_1''$ and $\lambda_N''$, given the slope, or first derivative of $\lambda_n$ at the endpoints n=1 and n=$N_s$ $$\frac{d\lambda}{dx} = \frac{\lambda_{n+1} - \lambda_n}{\rho_{n+1}^2 - \rho_n^2} - \frac{3A-1}{6}(\rho_{n+1}^2 - \rho_n^2)\lambda_n'' + \frac{3B-1}{6}(\rho_{n+1}^2 - \rho_n^2)\lambda_{n+1}''$$

where A and B are defined below. W. H. Press, S. A. Teukolsky, W. T. Vetterling, B. P. Flannery, *Numerical Recipes in C: The Art of Scientific Computing*, $2^{nd}$ Edition, Cambridge University Press, 1992, a common reference book of mathematical algorithms implemented in C, includes a routine for solving $\lambda_n''$.

Once $\lambda_n$ and $\lambda_n''$ have been tabulated, the cubic spline is used to find $\lambda$ for the given $\rho^2$ $$\lambda = A\lambda_n + B\lambda_{n+1} + \frac{1}{6}[(A^3-A)\lambda_n'' + (B^3-B)\lambda_{n+1}''](\rho_{n+1}^2 - \rho_n^2)^2$$

where n is determined such that $\rho_n^2 \leq \rho^2 \leq \rho_{n+1}^2$ and $$A = \frac{\rho_{n+1}^2 - \rho^2}{\rho_{n+1}^2 - \rho_n^2} \text{ and } B = 1 - A = \frac{\rho^2 - \rho_n^2}{\rho_{n+1}^2 - \rho_n^2}.$$

Note that A and B are real while $\lambda_n$ and $\lambda_n''$ are complex. The initial value x(t) 1201 is squared 1202 and also routed to the multiplier 1208. Not shown is a delay element to match the processing time of element 1202-07 to the signal transit time from 1201 to 1208. In this embodiment, the $\rho^2$ is used to select indices 1203 that reference the pre-computed lookup table values 1204, 1205. The quantities A and B, defined above, are computed 1206, preferably in parallel with the lookup operations. The spline interpolation 1207 combines results of both computations and lookup to generate a linearization factor $\lambda(\rho^2)$ [or $1(r^2)$] that is applied 1208 to the input 1201 to produce a predistorted output y(t) 1209 that is ready to be fed into the PA.

Training

Figure 13:
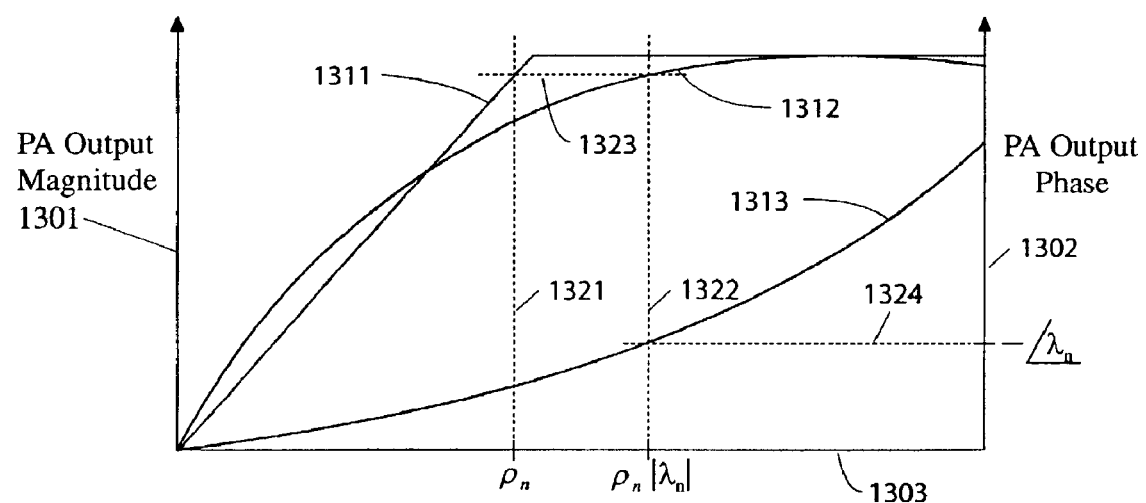
FIG. 13 depicts a graphical approach to determining parameters for a symbol transmission system.

Training the cubic spline PD consists of generating the lookup tables for $\lambda_n$ and $\lambda_n''$ (1204, 1205) where the goal is to find $\lambda_n$ such that $z_{ideal}(t)/z(t)$ approaches one. Given the complexity of the baseband model, particularly for the PA, finding $\lambda_n$ is challenging. Two methods of determination are detailed here. In FIG. 13, the PA output magnitude |z(t)| is plotted against one y-axis 1301 and the PA phase output is plotted against the other y-axis 1302. The PD input magnitude, $\rho$ is plotted against the x-axis 1303. The ideal PD/PA response 1311 is plotted as in FIG. 9. The actual PA magnitude response 1312 and the PA phase response 1313 are plotted.

A graphical approach to finding $\lambda_n$ is illustrated in FIG. 13, which is a variation of FIG. 9. For each $\rho_n$, the corresponding $|z_{ideal}(t)|$ (1323) is determined—this is the ideal PA output for that particular $\rho_n$. Next, the minimum PA input magnitude $|\hat{y}_n|$ that results in the ideal PA output magnitude is found (i.e., by reverse interpolation of the PA response determined above). Graphically, $\rho_n|\lambda_n|$ (1322) is plotted at the intersection of the construction 1323 and the curve 1312. Thus, the magnitude of $\lambda_n$ is $|\lambda_n|=|\hat{y}_n|/\rho_n$. The phase response of $\lambda_n$ (1324) is simply the negated phase response of the PA at $|\hat{y}_n|$.

A second approach is iterative and was used in the Matlab simulation. With this approach, the following expression is evaluated (simulated) repeatedly until the desired accuracy is obtained (typically 200 times)

$$\lambda_n^{(i)} = \lambda_n^{(i-1)} - \left[1 - \frac{z_{ideal,n}}{z_n(\lambda_n^{(i-1)})}\right]$$

where $\lambda_n^{(1)}$ is the 1-th iteration of $\lambda_n$ (and $\lambda_n^{(0)}=1$), $z_{ideal,n}$ is the ideal PA output for $\rho_n$ and $z_n(\lambda_n^{(i-1)})$ is the output of the PD/PA using $\lambda_n^{(i-1)}$ for $\rho_n$. This approach should converge for all expected PA responses.

From $\lambda''_n$ and the sets of equations defined above, $\lambda''_n$ can be determined for known or estimated initial conditions, $y'_1$ and $Y'_{N_1}$. A good approximation of these initial conditions can be obtained by measuring the slope of $\lambda_n$ at the end-points (i.e. between $\lambda_1$ and $\lambda_2$ to obtain $y'_1$ and between $\lambda_{N_1-1}$ and $\lambda_n$ to obtain $y'_n$). Given the relative importance of the lower amplitudes, once the first set of $\lambda''_1$ is determined, a multidimensional minimization can be performed on $\lambda''_1$ and $\lambda''_2$ to reduce the mean squared error between $z_{ideal}(t)$ and $z(t)$. This effectively compensates for any errors in the initial guess for $y'_1$.

Implementation

The implementation complexity of the cubic spline can be significant, however, the equations can be reduced by constraining the step size $h=\rho_{n+1}^2-\rho_n^2$ in the lookup tables such that $\lambda''_n$ is a constant power of two for all n and by setting $\rho_1^2==0$. In this case, the $\lambda''_n$ lookup table can be replaced by $\lambda'''_n=\lambda''_n h^2/6$.

With these constraints, the index into the lookup tables is simply $n=\lfloor \rho^2/h \rfloor$ where $\lfloor \bullet \rfloor$ is the floor function, and $A=n+1-\rho^2/h$ and $B=I-A=\rho^2/h-n$ (where the $1/h$ multiplication is simply a shift operation). The cubic spline equation then can also be simplified to the form $$\lambda = A\lambda_n + B\lambda_{n+1} + \left\lfloor (A^3 - A)\hat{\lambda}_n^n + (B^3 - B)\hat{\lambda}_{n+1}^n \right\rfloor$$

$$= A\left[(\lambda_n - \hat{\lambda}_n^n) + A^2\hat{\lambda}_n^n\right] + B\left[(\lambda_{n+1} - \hat{\lambda}_{n+1}^n) + B^2\hat{\lambda}_{n+1}^n\right]$$

where the $\lambda_n-\hat{\lambda}''$ term can be tabulated in the lookup table (rather than tabulating just $\lambda_n$). Based on this, the complexity of this solution should be no greater than 16 multiplications and 10 additions per transmitted sample (about 60% greater than the A&P scheme with $N_A$, $N_\Theta$, $N_c$ equal to $\{1,1,2\}$ and about 20% less than the A&P scheme with $N_A$, $N_\Theta$, $N_c$ equal to $\{2,2,4\}$).

Figure 14:
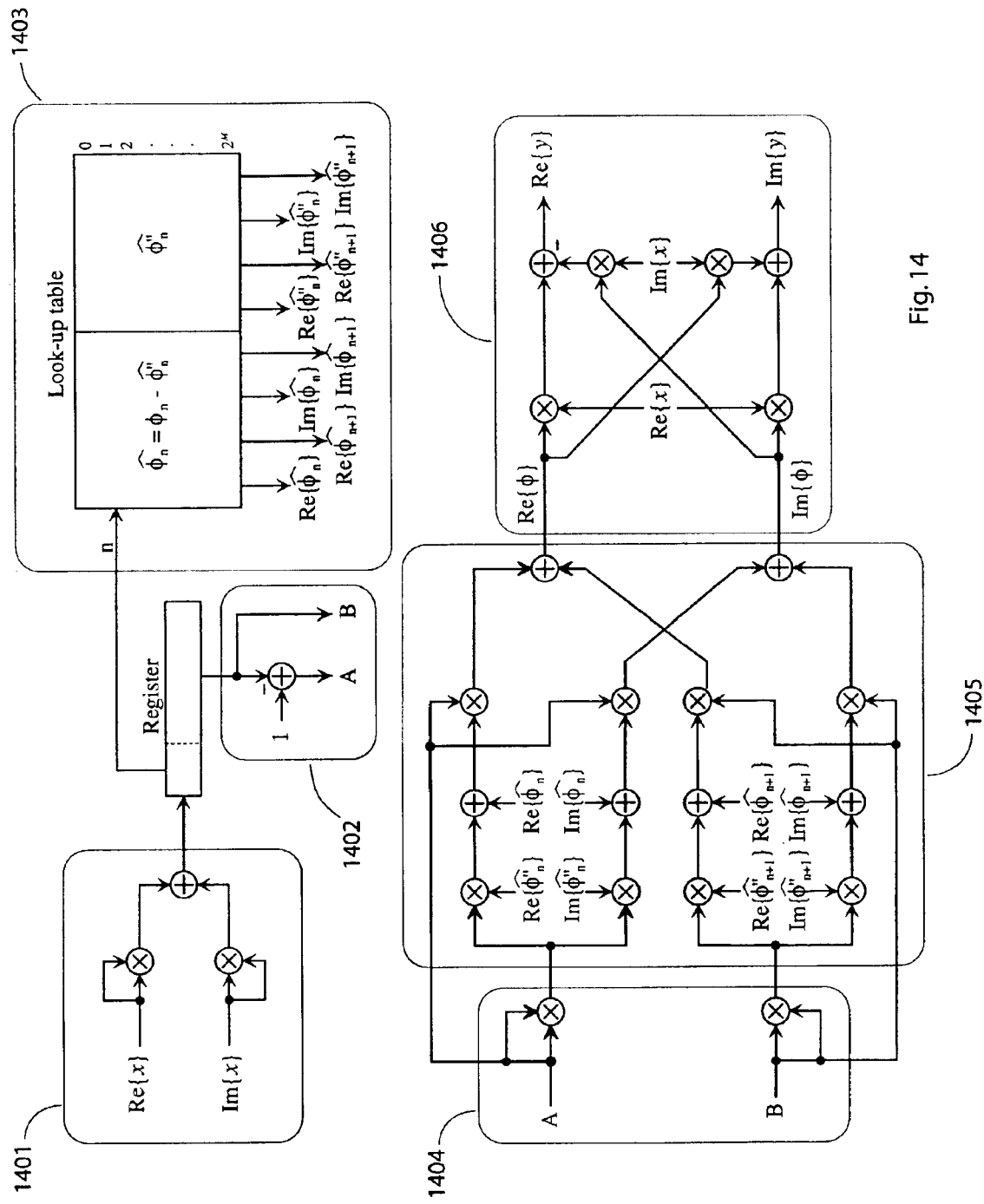
FIG. 14 depicts an implementation of portions of a predistorter utilizing a lookup table.
Figure 15:
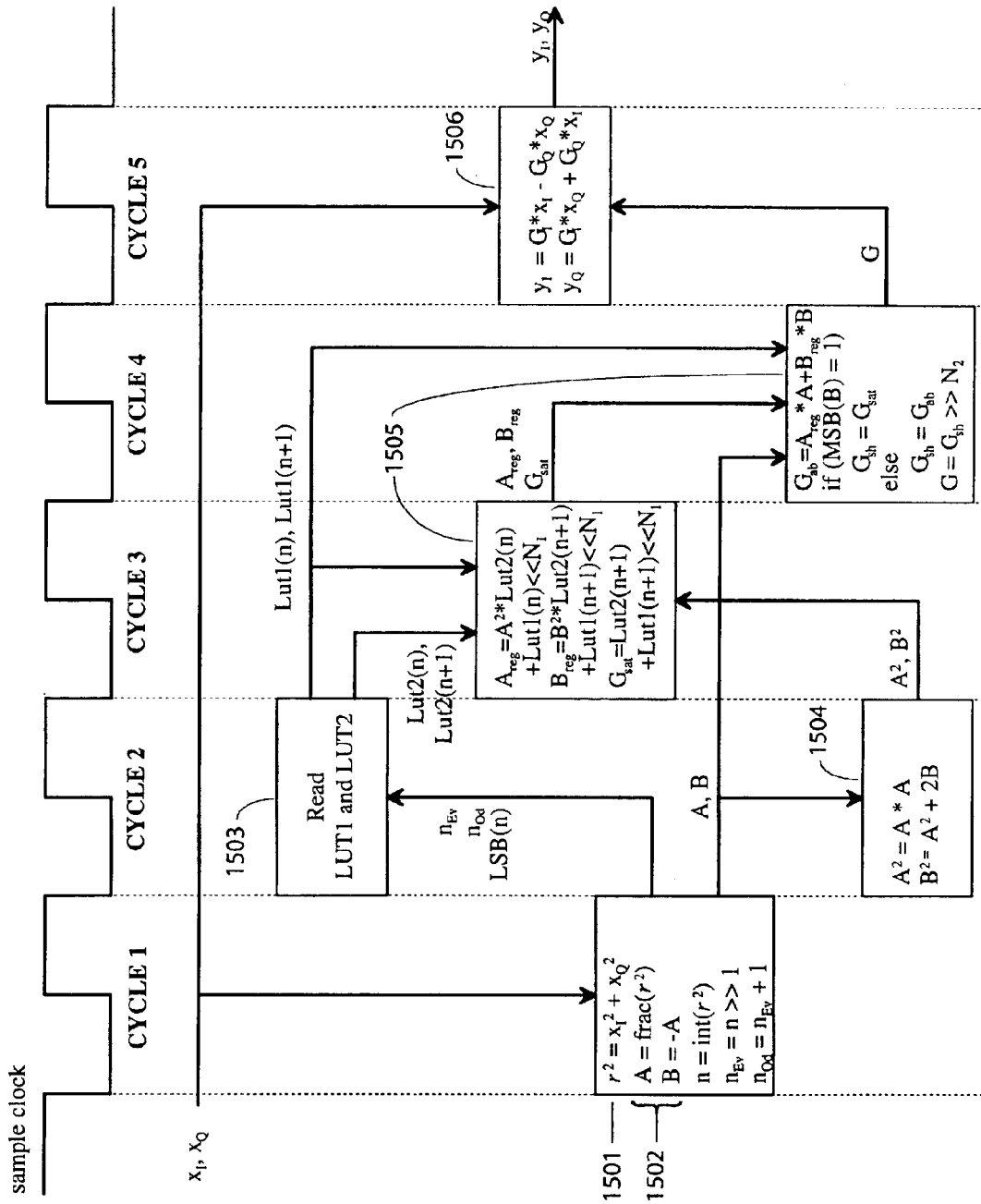
FIG. 15 is a timing diagram for operation of the predistorter.

A proposed implementation is illustrated in FIG. 14 where all values and operations are real. This implementation has been verified in Matlab. It is a small implementation. FIG. 15 is a timing diagram for the logic depicted in FIG. 14. The numbering of the figures is generally parallel. The initial input includes real and imaginary parts or in-phase and quadrature components of $x(t)$, which initially are squared to calculate a magnitude 1401, 1501. Intermediate values are calculated 1402, 1502. An index into the lookup table is also determined and the lookup table is read 1403, 1503 to obtain accordance and curvatures at complex points on either side of the calculated magnitude. Further intermediate values are calculated 1404, 1504 and 1405, 1505, to determine the appropriate predistortion. The calculated predistortion is applied 1406, 1506 to produce the predistorted signal $y(t)$.

Figure 16:
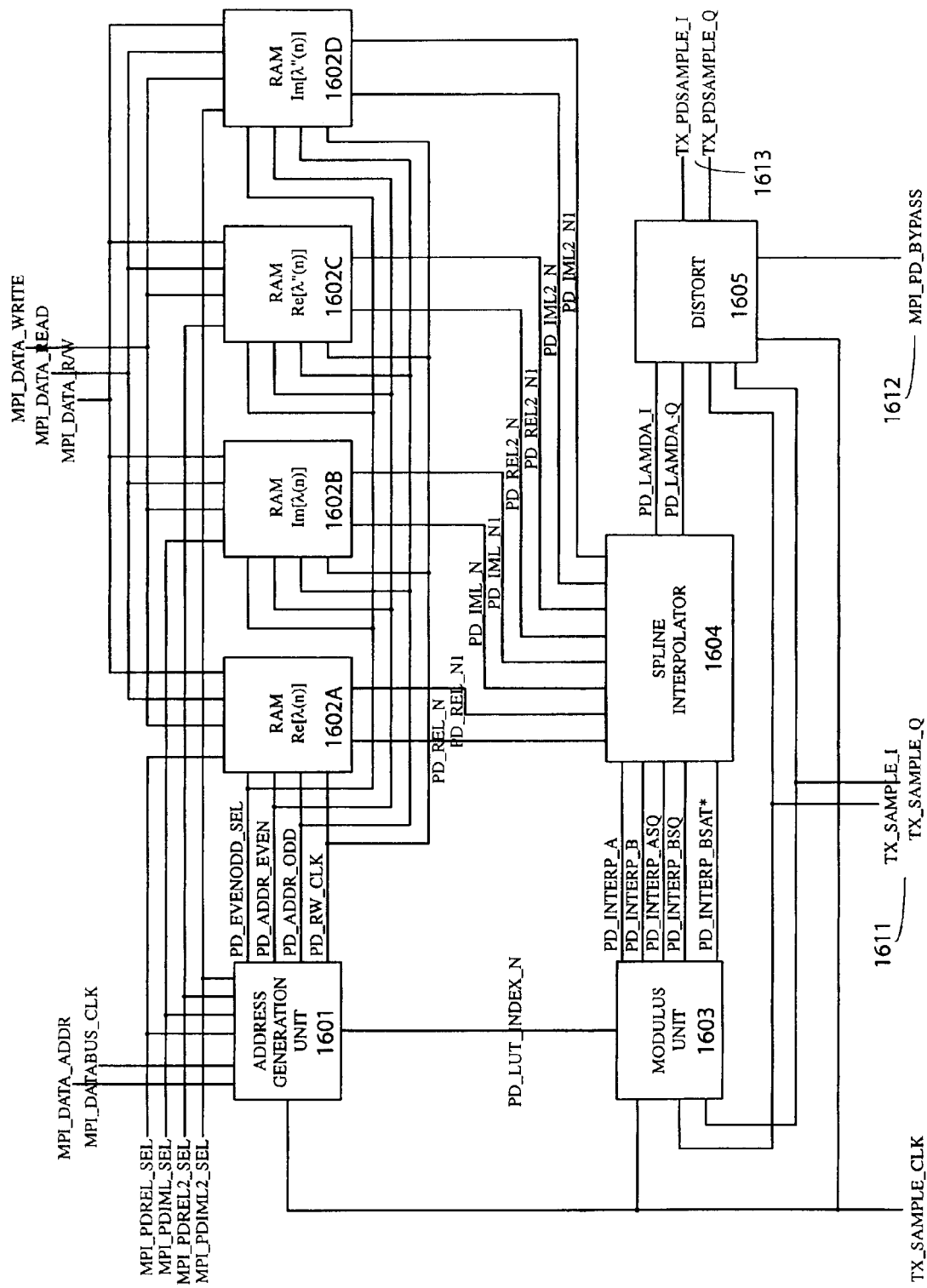
FIG. 16 is a block diagram of major logical units implementing the predistorter.

FIG. 16 depicts circuit components of the logic in FIG. 14. A signal naming convention is used where signals used to configure the predistorter are preceeded with 'MPI' implying microprocessor interface, signals used to connect the predistorter with the transmitter process are preceeded with 'TX', and all signals internal to the predistorter are preceeded with 'PD'. The RAM units 1602A–D can be initialized and read using the MPI write, read and read/write indicator signals where the address generation unit 1601 decodes the MPI addresses and MPI select lines to determine the correct location within the RAM blocks to write or read to. This location is conveyed using the even address, odd address and even/odd address select lines. When the predistorter is actively predistorting transmit samples, the modulus unit 1603 calculates, based on the in-phase and quadrature components of the transmit signal 1611, what the index into the RAM units is for the address generation unit, as well as several preliminary interpolation values for the spline interpolator 1604. The address generation unit translates the RAM index into the even address, odd address and even/odd select signals required by the RAM units. The RAM units output the look-up table values required by the spline interpolator. The spline interpolator uses the preliminary interpolation values from the modulus unit and the look-up table values from the RAM units to compute the in-phase and quadrature predistortion factors. The distort unit 1605 combines the sample clock, the input components 1611, and the results of spline interpolation to produce a predistorted signal 1613, unless a bypass signal 1612 is enabled. The function of a bypass signal is to disable predistortion.

An estimated gate count is given in the table below for a clock rate equivalent to the sample rate, twice the sample rate and four times the sample rate. It is proposed that all multipliers use 9 bits by 9 bits (based on the assumption that $x(t)$ is a 9 bit value) and that 9-bit values be stored in the lookup table. The lookup table length is assumed to be 17. Fewer bits may be used in the lookup table, particularly for the scaled second derivative, such as 5, 6, 7, or 8 bits, because the magnitude of the second derivative typically is smaller. The following assumptions on gate counts for various components are made: 9-bit by 9-bit multipliers require 250 gates (9×9×3), 9-bit by 9-bit adders require 30 gates (9×3) and that RAM requires 3 gates per bit. The following table estimates gate count for a cubic spline predistorter.

| | 1 × Sample Rate | | 2 × Sample Rate | | 4 × Sample Rate | |
|---|---|---|---|---|---|---|
| | # | Gates | # | Gates | # | Gates |
| Multipliers | 16 | 4,000 | 8 | 2,000 | 5 | 1,250 |
| Adders | 10 | 300 | 6 | 180 | 4 | 120 |
| Memory | 612 bits | 1,836 | 612 bits | 1,836 | 612 bits | 1,836 |
| Total | | 6,136 | | 4,016 | | 3,206 |

This is a modest number of gates in a 802.11a device, but a significant number of gates for many applications.

Performance Measures

The digital complexity incurred by predistortion should at least be offset by the performance improvements, complexity reductions achieved elsewhere and/or improvements in manufacturing yields. This section describes several performance measures intended for evaluating the predistortion methods described above. Implementation complexity is not considered a performance measure.

To illustrate these performance measures and to obtain preliminary performance results, these measures are tested using the Simplified Saleh PA model and the RFMD 2.4 GHz PA model. The OFDM transmitter was configured to comply with the 802.11a specification using windowing with $N_{tr}=1$. The simulations used the baseband model where quantization effects were ignored and the mixer was assumed to be perfectly balanced.

The A&P PD parameters were $N_A=1$, $N_\theta=1$ and $N_c=2$. The initial conditions for training the PD were $\beta_0=1$, $\beta_1=0$ and $\gamma_0=\gamma_1=0$. The multidimensional minimization executed up to about 5000 iterations. The Cubic Spline PD used lookup tables; of length $N_s=17$. The iterative approach to training with 200 iterations was used.

Figure 17:
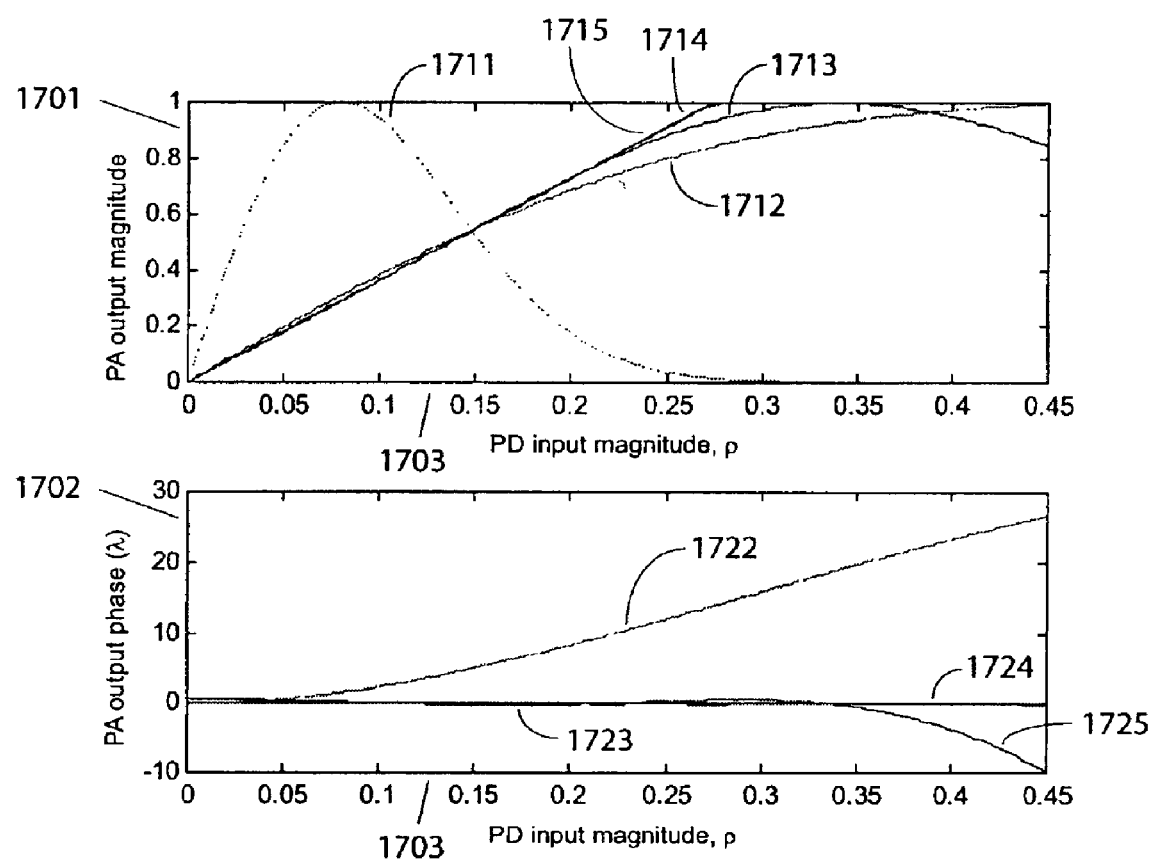
FIGS. 17 and 18 illustrate the combined predistorter and power amplifier response for a simplified Saleh power amplifier model and for a Radio Frequency Micro Devices ("RFMD") manufactured power amplifier model.

FIG. 17 illustrates the PD/PA response (magnitude and phase) for the Simplified Saleh PA model (with $G_{if}=6$ dB). The horizontal axis 1703 in each plot represents the predistorter input magnitude ρ. The vertical axes are normalized output magnitude 1701 and phase angle 1702. Lines 1712 (magnitude) and 1722 (phase) correspond to the PA response without predistortion. The ideal PD/PA response lines 1714, 1724 are straight—the magnitude line 1714 is straight from the origin to the top of the plot and flat along the top of the plot, for x>=0.274 and y=1.0. The PD/PA response lines for the A&P (1713, 1723) and cubic spline predistorters (1715, 1725) depict the performance of the system with predistortion. (The cubic spline PD dashed lines in this figure are so accurate that it is nearly indistinguishable from the ideal response lines.) As a reference, the Rayleigh distribution of ρ is also shown 1711. In this case, $\rho_{clip}=0.273978$ which corresponds to a clip rate of approximately $10^{-3}$ and a PBO of about 7.7 dB.

Figure 18:
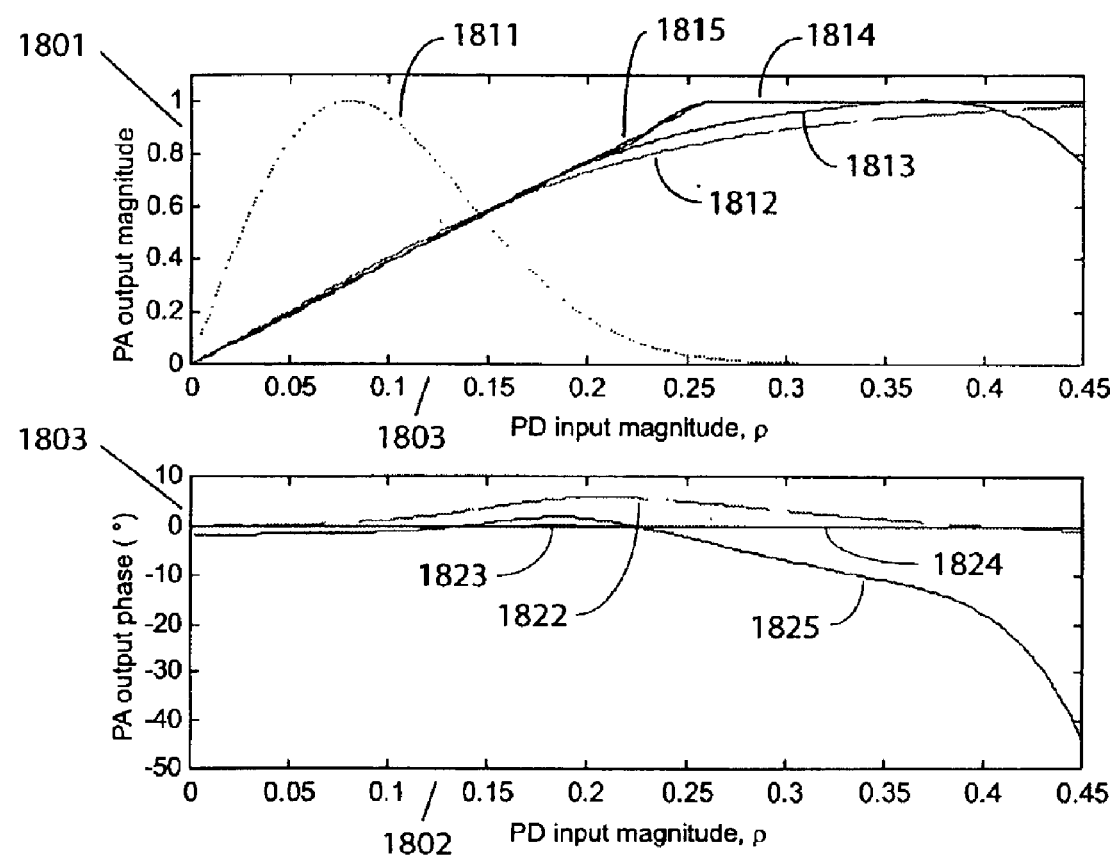

FIG. 18 illustrates similar statistics for the RFMD PA model (with $G_{if}=6$ dB). Reference numbering in this figure parallels FIG. 17. Again, the response of the cubic spline PD is so close to ideal, it is difficult to see. Here, $\rho_{clip}=0.258557$, which corresponds to a clip rate of about $5\times10^{-3}$ and a PBO of about 7.2 dB.

In FIG. 17 and FIG. 18, the A&P PD appears to have more difficulty correcting for the RFMD PA than for the Simplified Saleh model, whereas the cubic spline PD is very good in both cases. This is expected by the nature of the cubic spline interpolation and confirms the reliability of the cubic spline PD.

Three performance measures are developed below: spectral regrowth, transmit signal integrity and link margin improvements.

Spectral Regrowth

Spectral regrowth refers to the creation of out-of-band signal energy due to intermodulation products resulting from PA non-linearities. Spectral regrowth may cause the transmit PSD to exceed the PSD mask requirements specified in the 802.11a specification. If this occurs, additional power back off is required reducing the signal strength, thus compromising data rate and reach.

Predistortion reduces spectral regrowth by removing some or all PA distortion. Distortion can be categorized as non-linearities of the PA which can be compensated for with PD and PA saturation or clipping which cannot be compensated for with PD. As shown above, clipping can be removed only if $P_{BO} \geq 13$ dB. Typically a much smaller PBO is desired, thus some spectral regrowth is expected.

Figure 19:
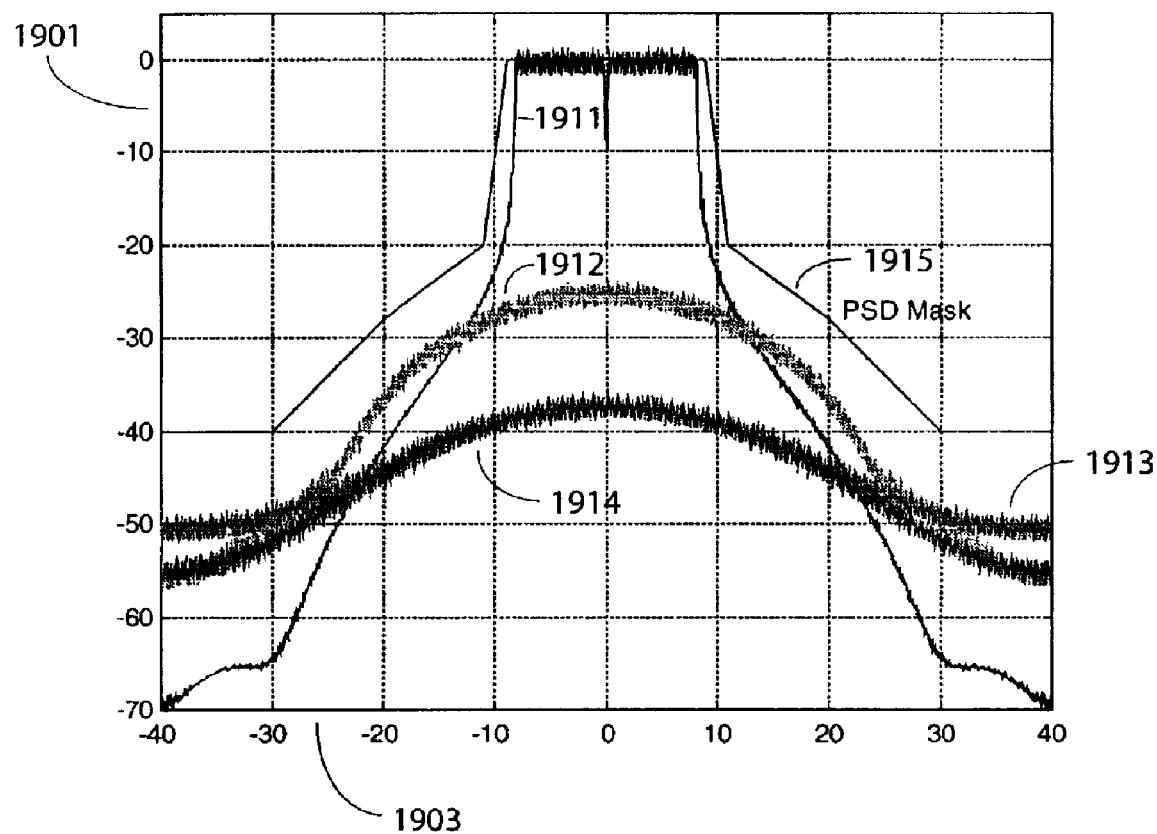
FIG. 19 shows the PSD of error vectors in various cases.

FIG. 19 shows the PSD of the error vectors (i.e. PSD of the difference between the PA output and the perfect PA output) for the cases of no PD, cubic spline PD and ideal PD, for an RFMD at 2.4 GHz, PBO=7.2 dB. The ideal transmit PSD 1911 as well as the PSD mask 1915 are provided for reference. These were obtained by simulating the PSD of 5000 OFDM symbols. The following observations can be made: The SNR without PD 1912 is about 25 dB whereas with PD 1913 it is about 38 dB resulting in a 13 dB improvement. In the passband, the cubic spline PD's PSD 1914 is identical to that of an ideal PD. The PSD is not flat (although somewhat worse without PD), thus the center frequency carriers will suffer worse SNR than the outer carriers. Even without PD, the PSD is well below the allowed PSD mask.

The error vectors used to generate FIG. 19 are simply the difference between the PA output z(k) and a the output of a perfect PA $z_{perfect}(k)=x(k)/\rho_{clip}$. Given that these error vectors are deterministic. Given x(k) and the characterized PA, z(k) could be computed analytically without simulation.

Transmit Signal Integrity

The 802.11a specification defines a transmit modulation accuracy test for determining the relative constellation error at the output of the transmitter. These guidelines dictate the maximum transmitter distortion allowed for an 802.11a compliant device. A major source of distortion is the PA. Other sources include quantization, clipping of $x_1(t)$ and $x_Q(t)$, phase noise and gain/phase imbalance, which are not considered here.

The transmit modulation accuracy test specifies a test that computes the average RMS error, $Error_{RMS}$, of the transmitted signal (also called the relative constellation error). The relative constellation error is measured at a receiver incorporating frequency compensation and frequency domination equalization. A good channel (i.e. wired or short range line of sight) is assumed and it is encouraged that the test measurements be averaged over many OFDM symbols and frames. The test proposes that for each received constellation point, an error vector be computed as the difference between the transmitted point and the received point. The $Error_{RMS}$ is then computed as the ratio of the magnitude of the error vector averaged over all carriers (and multiple packets and frames) to the average power of the transmitted constellation points. The table below lists the maximum allowed relative constellation error verses data rate.

| Data rate (Mbits/s) | $Error_{RMS}$ (dB) |
| --- | --- |
| 6 | −5 |
| 9 | −8 |
| 12 | −10 |
| 18 | −13 |
| 24 | −16 |
| 36 | −19 |
| 48 | −22 |
| 54 | −25 |

To measure the relative constellation error due to the PA with and without predistortion using the proposed modulation accuracy test requires considerable simulation time. An alternative approach is to perform this test in the time domain using an analytical approach. Specifically, using known PA output as a function of the predistorter input (see FIG. 17 and FIG. 18 and the known probability distribution of the predistorter input, the relative constellation error can be computed directly without simulation.

The error vector magnitude as measured at a receiver is simply the difference between the perfect PA response $z_{perfect}(k)=x(k)/\rho_{clip}$ (this perfect response is identical to but without clipping) and the actual PA output z(t) passed through a fixed receiver equalizer. Mathematically, this is $$evm(\rho)=|G_{eq}ze^{-j\theta_{eq}}-x|\rho_{clip}|$$

where $G_{eq}$ represents the ideal receiver equalizer gain, $\theta_{eq}$ represents the ideal receiver equalizer phase and the reference to time has been dropped given that evm(ρ) is a function of ρ and not time. The mean squared error vector magnitude is just the weighted average of all the possible error vector magnitudes $$EVM = \int_0^\infty |G_{eq}ze^{-j\theta_{eq}} - x/\rho_{clip}|^2 p(\rho)d\rho$$

where p(ρ) is the pdf of ρ.

The equalizer will apply a gain such that the average energy of the received z(t) will be equal to the perfect signal. The average energy of $x(t)/\rho_{clip}$ is simply $2\sigma_x^2/\rho_{clip}^2$. Thus, the ideal receiver equalizer magnitude compensation is $$G_{eq} = \sqrt{\frac{2\sigma_x^2}{\rho_{clip}^2}[\int_0^\infty |z|^2 p(\rho)d\rho]^{-1}}$$

where the integral represents the average energy of the PA output signal. Recall that a requirement of predistortion was that the output power with and without predistortion be equal. Thus, $G_{eq}$ should be very close to unity in all cases, with any small deviations due only to the power lost due to clipping or an imperfect predistorter.

The phase angle $\theta_{eq}$ that the ideal equalizer will apply will be that which minimizes the averaged error vector magnitude. This is derived in the appendix and is $$\theta_{eq} = \tan^{-1}\frac{\int_0^\infty [z_Q x_I - z_I x_Q]p(\rho)d\rho}{\int_0^\infty [z_I x_I + z_Q x_Q]p(\rho)d\rho}.$$

Note that $G_{eq}$ and $\theta_{eq}$ are effectively applied to all carriers. Given that the PSD of the error vector is not flat, it may be possible that a frequency domain equalizer individually compensating each carrier will perform better than predicted here.

The RMS error (relative constellation error) is the ratio of the averaged error vector magnitude in the bandwidth of interest to the average transmitted signal strength. The EVM analytically computed above is the total error magnitude and does not discriminate error energy in the bandwidth. Thus, if $R_{EVM}$ represents the portion of the error magnitude in the passband, then $$\text{Error}_{RMS} = \sqrt{\frac{R_{EVM} \times EVM}{2\sigma_x^2/\rho_{clip}^2}} = \sqrt{R_{EVM} \times EVM \times P_{BO}}$$

$R_{EVM}$ can be computed from the PSD of the error vectors as obtained above as the ratio of the area under the error PSD in the passband (i.e. between −8.25 and 8.25 MHz) and the total area under the error PSD. This ratio approach implies that the actual magnitudes of the PSD are less important than the shape of the PSD. Thus, if simulation is used to determine the PSD, a large simulation is likely not required.

Figure 20:
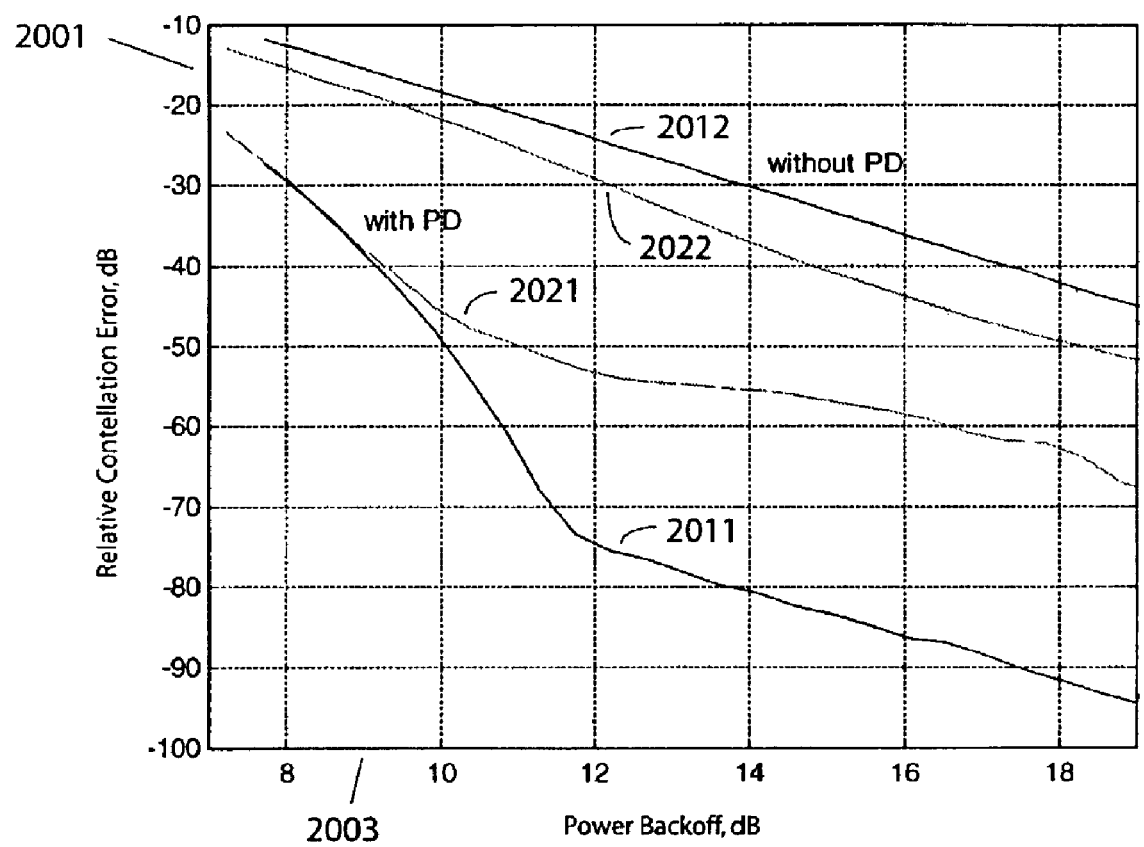
FIGS. 20 and 21–22 illustrate two measures of improved signal-to-noise ratio after predistortion.

FIG. 20 illustrates the relative constellation error 2001 with and without predistortion as a function of the PA's power backoff 2003 for both the Simplified Saleh model and 2.4 GHz RFMD PA models with and without predistortion. For the Simplified Saleh model (2011, 2012), predistortion offers 18 to 50 dB of improvement while for the RFMD PA (2021, 2022), 10 to 25 dB improvement is seen. Comparing this with the table above, and particularly for the higher data rates, predistortion allows several less dB of power backoff.

Link Margin Gain

Figure 21:
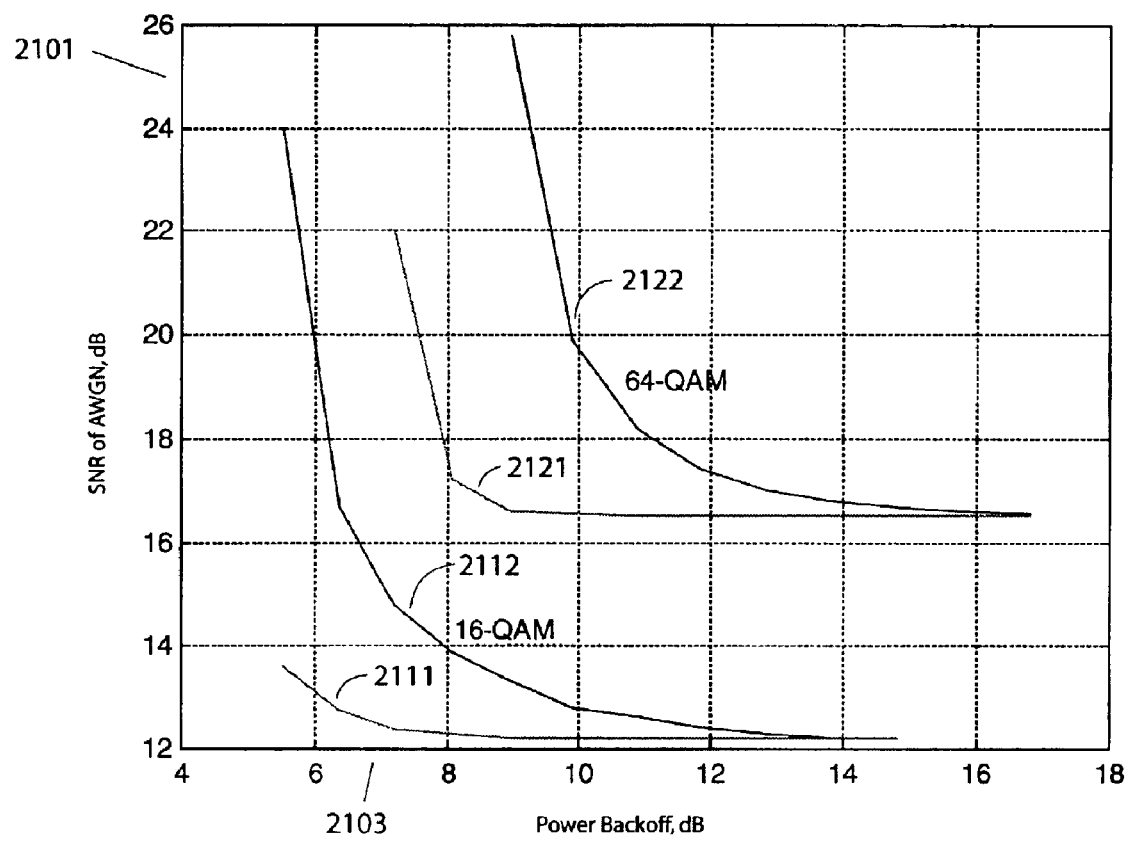
Figure 22:
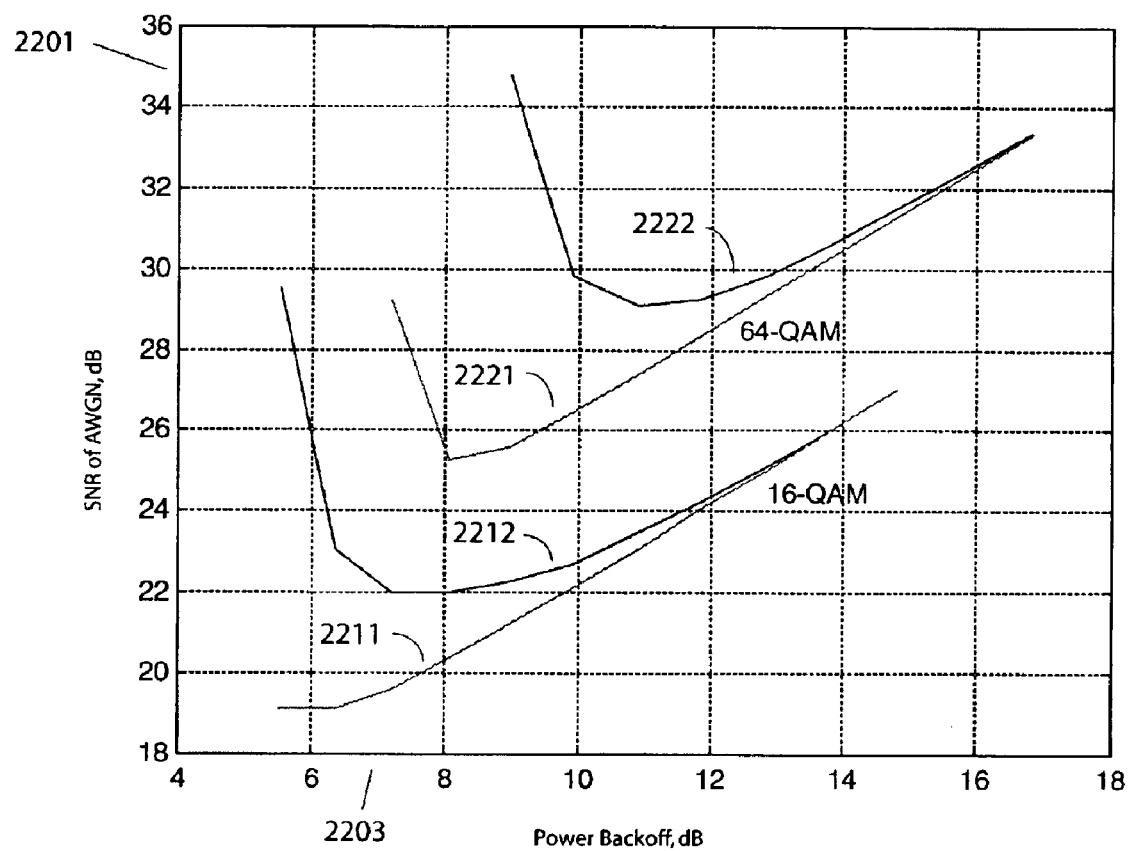

FIGS. 21–22 illustrate improvement in SNR resulting from predistortion. An oversampling rate of 2 was used and the 16-QAM constellation was used for some data. The 64-QAM constellation was used for other data. 2048 OFDM symbols transporting randomly generated data were used for the simulations.

In FIG. 21, the impact of clipping is depicted. In FIG. 22, the impacts of clipping and reduced transmission power are combined. As a result, in FIG. 21, increased power backoff asymptotically eliminates the effect of clipping, producing a horizontal tail. In FIG. 22, combining the two effects produces bowl-shaped curves, from which a minimum or a preferred power backoff can easily be read. In both figures, the vertical axis 2101, 2201 depicts the minimum signal-to-noise ratio between the OFDM-carrying signal and the background average white Gaussian noise (AWGN, in dB) that is required to maintain a bit error rate (BER) of 10e-4 or better. The horizontal axis 2103, 2203 measures power backoff in dB. From the results above, this power backoff corresponds to a probability of clipping an OFDM signal and is alternatively described as the average power output of a PA. Either power backoff or average power output can be directly implemented by adjusting a preamplifier located between the predistorter and the PA. In both figures, the four curves depict the effect of clipping noise on the required signal-to-noise ratio for a pair of symbol constellations, 16-QAM and 64-QAM symbols. Curves 2111, 2211 and 2112, 2212 depict the signal-to-noise ratio for the 16-QAM symbols with and without predistortion, respectively. Curves 2121, 2221 and 2122, 22212 depict the signal-to-noise ratio for the 64-QAM symbols with and without predistortion, respectively. In FIG. 22, the four curves depict the same data as in FIG. 21, but the curves combine the effect of clipping noise with the effect of power backoff. In an asymptotic segment of a curve that was horizontal in FIG. 21, for instance for a power backoff of 10 or more dB for 64-QAM symbol 2121, the curve segment in FIG. 22 approximates a 45 degree slope 2321. This is because the power backoff, measured in dB, directly reduces the signal-to-noise ratio. A minimum power backoff can easily be read from FIG. 22, by selecting a point on the curve relatively close to the x-axis. Some critical values for power backoff can be read from these curves. The decrease of only 0.5 dB in power backoff beyond a minimum power backoff has a significant impact. A decrease of 1 dB in power backoff beyond a preferred power backoff has a very substantial impact. A wider range of increased power backoff continues to provide benefits due to predistortion. An increased power backoff of 1–2 dB retains much of benefits of predistortion. In increased power backoff of 4 dB still delivers a noticeable improvement in signal-to-noise ratio. An increase of even a dB produces in equivalent signal-to-noise ratio.

Recall that the suppression of spectral regrowth is a performance criterion. FIG. 19 shows the PSD for the ideal, predistorted and non-predistorted signals. The benefit of applying predistortion is readily apparent in that the skirts of the PSD are reduced by up to 6 dB in the roll-off region and by over 10 dB in the adjacent channel region.

Figure 23:
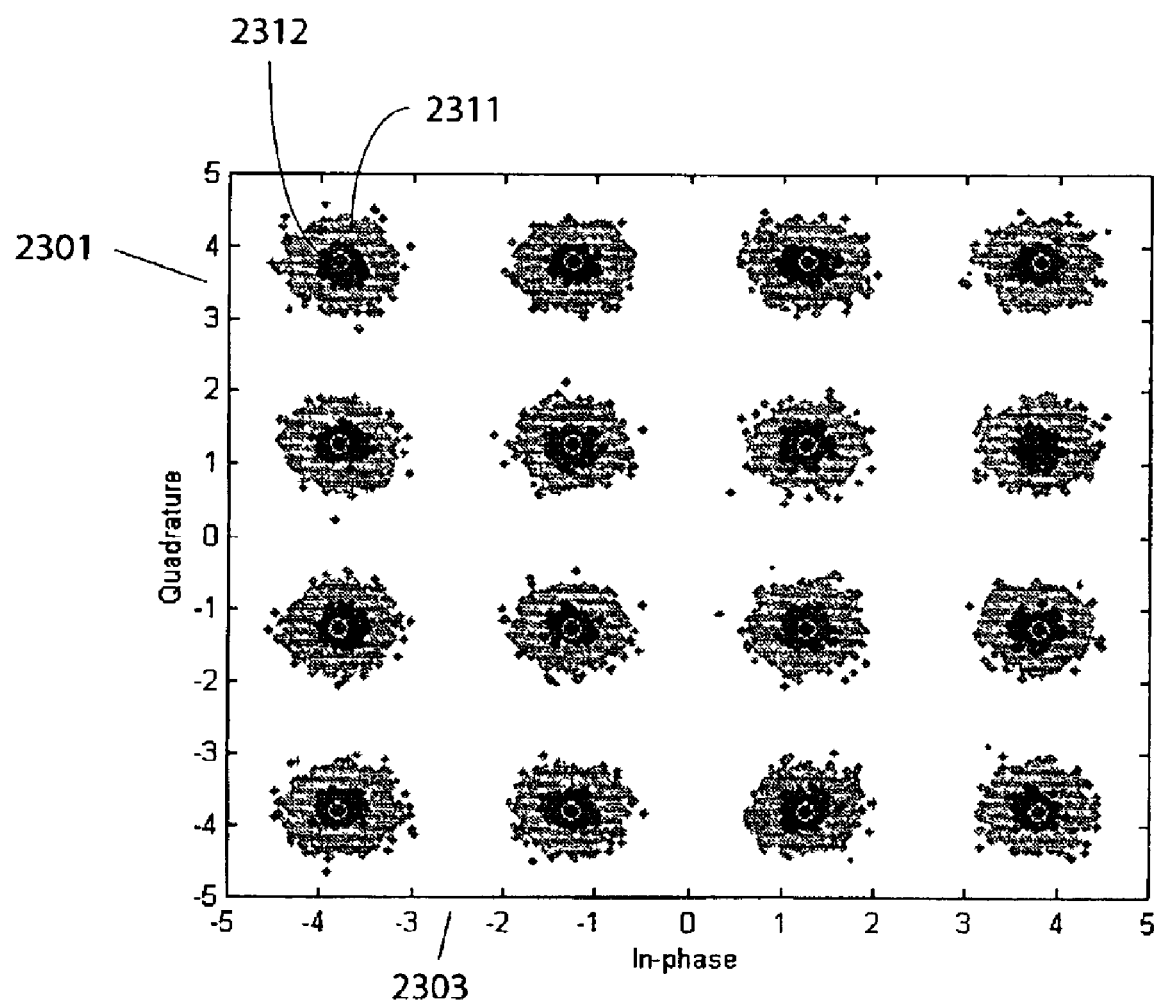
FIG. 23 is a complex eye diagram depicting similar data.

A second performance criterion was improvement of transmit signal integrity (similar to the test proposed in the 802.11a standard for the Transmit Modulation Accuracy Test). This is illustrated in FIG. 23 where the complex eye diagram of the transmitted signal is shown. This diagram depicts a received signal with no channel effects or noise added and perfect receiver equalization applied. The quadrature component is graphed on the y-axis 2301 and the in-phase component on the x-axis 2303. The outer area 2311 shows the dispersion of the received signal when PD is not applied. The inner area 2312 shows the dispersion for the same transmitted signal but when PD is applied. The ideal dispersion is of course a single dot or small circle in the middle of the inner area 2312. For each received signal point, an error vector was computed and the average magnitude of the error vector determined to obtain a measure of the signal-to-distortion level. In this case, a 13.37 dB improvement was noted. The following parameters were recorded:

$z_{clip}$=0.546852

Average phase error without PD=−5.088457°

Average phase error with PD=0.002465°

Signal-to-distortion level without PD=23.763915 dB

Signal-to-distortion level with PD=37.136871 dB

Predistortion Training

Several predistortion schemes are described above, including algorithms for their training. These training algorithms assume that the AM-to-AM and AIM-to-PM responses of the PA are known. This section describes the more global case of training the predistorter when the PA characteristics, transmit PSD mask, transmit signal integrity and power backoff levels must be determined.

Training can be performed at one of several stages. For instance, during product design: As PA's are selected, they are characterized and a corresponding set of PD coefficients is obtained. These coefficients are hard coded into the device. This assumes that the distortion of a particular PA model does not change significantly from part to part or over time. Alternatively, as part of the manufacturing process, an external device characterizes the PA of each transmitter and a corresponding set of PD coefficients computed. These coefficients are then stored back into non-volatile memory in the device. This method allows for fluctuations in parts however, still assumes that the PA does not change significantly over time. As a further alternative, during operation, perhaps as part of a start-up routine, the PA is characterized using a feedback path internal to the transmitter. The coefficients are then stored in non-volatile memory in the device. This method allows for the greatest variability in both parts and time.

The process of training the PD for production includes the following steps. Characterize the PA: Using the network analyzer method, the 802.11a transmitter method or another equivalent method, determine the AM-to-AM and AM-to-PM response of the PA. Using the PD training methods described above, determine the PD coefficients for a range of IF gains, $G_{if}$. Compute the link margin as a function of $G_{if}$ and select the $G_{if}$ that maximizes the link margin. Determine the transmit PSD and transmit modulation accuracy and compare with the maximum allowed values. If either of these tests fail, reduce $G_{if}$ and repeat the measurements until the requirements are met. Load the PD coefficients into the 802.11a transmitter. Optionally, verify the PD operation by measuring the PSD and transmit modulation accuracy.

Predistortion Methods

The relationships for a system transmitting OFDM symbols among the probability of clipping; power backoff and average power output of the power amplifier described above enable one to calibrate one or more components of an OFDM symbol transmission system based on a calculated probability of clipping an OFDM symbol. One embodiment of the present invention is a method of calibrating an operating range of a predistorter corresponding to the calculated probability of clipping an OFDM symbol. This method can be applied to the predistorter in a system including a predistorter and a power amplifier or a system including a predistorter, preamplifier and power amplifier. Depending on the design of the predistorter, the operating range may include the full range of inputs to the predistorter or may include a range of inputs above which the output of the power amplifier will be saturated. Calibration may include mapping a certain high predistorter input value to an output value at which the power amplifier will be saturated. This may be done more or less precisely, attempting to use the saturation point of the power amplifier or a one dB below saturation point value. A wide range of inputs may be mapped so the inputs above a certain value produce a saturated or nearly saturated power amplifier output, or the same range of inputs may be clipped, prior to processing by the predistorter, so that values above the high predistorter input value are reduced. Given the calculated probability of clipping an OFDM symbol, a probability distribution can be determined based on generation of random OFDM symbols. Alternatively, the probability distribution can be produced by sampling a selected transmission stream.

An alternative embodiment is a method of calibrating average power output of the power amplifier, instead of an operating range of the predistorter. This method includes calibrating a preamplifier to produce an average power output of the power amplifier corresponding to the calculated probability of clipping an OFDM symbol. Alternatively, this might be described as calibrating the power backoff of a preamplifier corresponding to the calculated probability of clipping an OFDM symbol. The two are equivalent, as demonstrated above. In practice, a programmable gain control of the preamplifier can be adjusted to control the average power output of the power amplifier, based on a probability distribution for a plurality of OFDM symbols.

Alternatively, both the operating range of the predistorter and the average power output of the power amplifier can be calibrated corresponding to the calculated probability of clipping an OFDM symbol. The operating range of the predistorter can be matched to the average power output of the power amplifier by various means, including adjusting a gain of the preamplifier position between the predistorter in the power amplifier.

Applying criteria described above, the further aspect the present invention is to select a preferred probability of clipping an OFDM symbol and calibrating either in input range of a predistorter or a power backoff or an average power output of the power amplifier to the preferred probability, wherein selecting the preferred probability of clipping takes into account calculated noise resulting from clipping and tolerance of the OFDM symbol transmission system to random noise in this sense, random noise may include white Gaussian noise. Any these embodiments may readily be adapted to further take into account systematic noises or to provide an extra margin to guard against transient noises.

An alternative embodiment of the present invention operates iteratively over a range of probabilities of clipping an OFDM symbol, certain values are calculated. These values include clipping noise resulting from calibrating an input range to the predistorter to a particular probability of clipping and tolerance of the overall system to random noise resulting from operating at an average power output of the power amplifier corresponding to the particular probability of clipping. FIG. 22 illustrates combining these two effects, where a probability of clipping can be directly related to power backoff. In this embodiment, the method further includes selecting a parameter, which may be a preferred probability of clipping, a power backoff, an average power output of power amplifier, or a preamplifier gain value, corresponding to a preferred probability of clipping an OFDM symbol and further calibrating the input range of the predistorter and the average power output of the power amplifier to the parameter. Referring to selecting a parameter, without specifying which of the interrelated parameters is selected, makes it clear that a variety of mathematically interrelated parameters can be used interchangeably for calibration of the system. Expressed somewhat differently, this iterative approach may be exercised over a range of power amplifier backoff values or a range of preamplifier gain values or a range of power amplifier average power output values. In any iterative approach, determining the tolerance of the system to random noise may include simulation or empirical evaluation of system output, such as measurement of error vectors of a signal received from the OFDM symbol transmission system. An empirical evaluation of system output preferably includes measurement of the signal with minimal environmental noise. In some configurations, the signal can be measured directly, without transmitting and receiving antennas.

The methods and devices of the present system are readily adapted to device production. In one embodiment of the method, determining a predistortion pattern and the power backoff setting for a system including a predistorter in communication with the power amplifier includes measuring a power amplifier response curve of the power amplifier and deriving an inverse power amplifier response curve. The power amplifier measured may be component of the loaded system, or may be typical of power amplifiers used in the loaded system. For a range of power backoff settings, a particular power backoff setting or other parameter is selected, corresponding to a calculated OFDM symbol clipping noise and to random noise tolerance of the system. An upper input threshold is mapped to a particular power backoff or other parameter such that the upper input threshold causes the power amplifier to be saturated or nearly saturated. The inverse power amplifier response curve, scaled to the upper input threshold and a power backoff parameter are loaded into the system. One aspect of this method is then a particular power backoff parameter can be adjusted to take into account additional sources of noise, or regulatory limits (either governmental or standards-based) of RF emission.

The analysis above describes how to maximize the tolerance of the system to the combination of clipping noise and random noise for an OFDM symbol sequence. At the same time, it demonstrates various ranges of critical response of the system with greater or lesser power backoff settings. In an alternative embodiment, the present invention includes a method of configuring a system including a predistorter in communication with the power amplifier, including calculating a first system parameter that enhances the tolerance of the system to a combination of clipping noise and random noise for an OFDM symbol sequence. From the first system parameter, a power backoff value and an upper input threshold for the predistorter can be derived. In addition, an inverse response curve can be determined corresponding to a power amplifier response curve and the upper input threshold. The system can be loaded with a representation of the inverse response curve and the power backoff value, the complete configurations the system. In this embodiment, the representation of the inverse response curve may be cubic spline lookup table. The power backoff value or the first parameter can be adjusted to take into account regulatory limits on RF emissions, system noise or to guard against transient noises. Critical ranges for adjusting the first parameter, either decreasing or increasing the power backoff value, may be selected in accordance with the ranges read from FIGS. 21 and 22. These ranges may include a decrease of one or 0.5 dB in the power backoff value and an increase of 1, 2, 4 or 8 dB in the power backoff value. This method is adapted to production, in that the power response curve may be measured from a component of a loaded system.

A graphical method also may be used to determine system parameters. In the graphical method, the power probability distribution for a sample OFDM symbol sequence is determined, for instance by simulation or measurement. A power amplifier response curve also is determined. An ideal response curve is selected such that a weighted sum of differences between corresponding points along the ideal response curve and the measured power amplifier response curve is approximately zero. The sum of differences is weighted to correspond to the power probability distribution. A power backoff value can be determined from the ideal response curve, corresponding to a point on the ideal response curve at which the power amplifier will saturate or nearly saturate. One aspect of the graphical method is that the ideal response curve may be represented as a straight line. The further aspect of this method includes calculating a predistortion curve as a cubic spline transformation of the ideal response curve to the power amplifier response curve.

Performance Evaluations

Measuring the PSD Improvement Using the AMIQ

Figure 24:
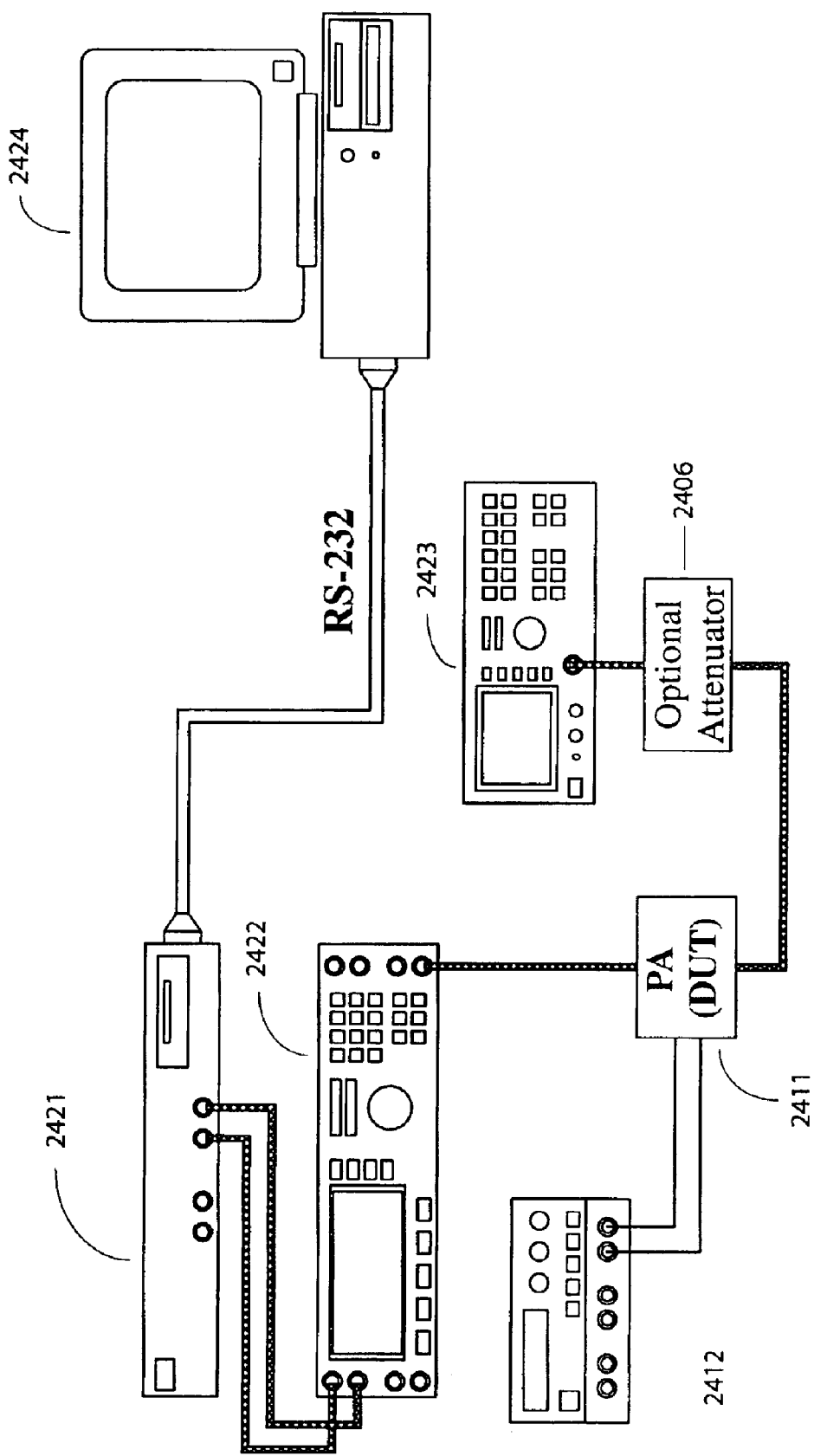
FIG. 24 is a test setup.

This test is used to verify the improvements in the PSD seen through simulation when predistortion is applied. FIG. 24 shows the test set-up. A baseband OFDM signal is stored on the PC 2424 as two data files, one containing the digital samples for the in-phase channel (I) and the other containing the digital samples for the quadrature (Q) channel. Using the software supplied with the Rohde & Schwartz IQ modulation generator (AMIQ) 2421, these samples are downloaded to the AMIQ. These signals are converted to analog using the AMIQ's two 14-bit D/A's and then passed into the HP E4433B ESG-D series Signal Generator 2422. The Signal Generator mixes the signal to RF and applies gain. This RF signal is passed into the PA 2411 under test and then into the Spectrum Analyzer 2423. The PA is powered by a DC power supply 2412. An optional attenuator 2406 may be used prior to the Spectrum Analyzer to avoid overdriving the Spectrum Analyzer's receiver.

The I and Q samples should be generated for a fixed IF gain $G_{if}$ once with the PD disabled and once with the PD enabled. A Matlab simulation program can be used to generate such samples. Make note of the PSD with and without PD applied, the average gain of the PA when predistortion is disabled and the average gain of the PA when PD is enabled. The output power of the PA should be fixed regardless of whether or not predistortion is applied.

Configuration of the components is straightforward. The Rohde & Schwartz IQ Modulation Generator is configured by selecting the sampling rate according to the sampling rate of the I and Q samples. The HP E4433B Signal Generator is configured as follows: Select the carrier frequency according to intended frequency of operation (2.437 GHz for 802.11g and 5.2, 5.3 and 5.775 GHz for 802.11a). Enable modulation and RF output. The HP 8593E Spectrum Analyzer is configured as follows: Select the center frequency equal to the carrier frequency of the Signal Generator. Select the frequency span to be 40 or 50 MHz. Optionally, enable video averaging, particularly for power measurements.

In order to match the results of this test with those found in simulation, the operating point of the PA for the test must be calibrated to that used in the simulation. Given the gain of the AMIQ, Signal Generator and cabling as well as the different methods of measuring power in this test versus the tests used to characterize the PA, a relative approach to calibration can be used. In particular, the gain of the PA without PD and the gain of the PA with PD should be matched to those found in the simulation all the while ensuring that the output power of the PA remains constant regardless of whether or not the PD is enabled. This calibration includes some or all of the following steps: Generate two sets of baseband signals on the PC—one without PD and the other with PD (e.g., using a Matlab simulation tool). Note the PSD and PA gain in each case. Download the set of I/Q samples corresponding to the case when the PD is enabled to the AMIQ generator. Measure the output, power of the PA using the Spectrum Analyzer (integrate the power over the used bandwidth). Remove the PA from the circuit and perform another power measurement to obtain the gain. Adjust the output amplitude of the Signal Generator and repeat the previous step until the gain of the PA matches that found in simulation. Note the final output power of the PA. Download the set of I/Q samples corresponding to the case when the PD is disabled to the AMIQ generator. Adjust the output amplitude of the Signal Generator until the output power of the PA matches that found when predistortion was enabled. Remove the PA and perform another power measurement to obtain the gain of the PA when pre-distortion is disabled. This should be close to that measured in simulation (some deviation is expected due to the small impact that small variations in the output amplitude of the Signal Generator have on the PA gain). If the PA gain is not sufficiently close to that obtained in simulation, repeat the process while forcing the output power of the PA up or down slightly.

Once the test setup has been calibrated, the PSD masks for both cases can be displayed (overlaid) to determine the improvement provided by predistortion. Typically, the peak PSD is of interest.

RFMD 2.4 GHz PSD

Figure 25:
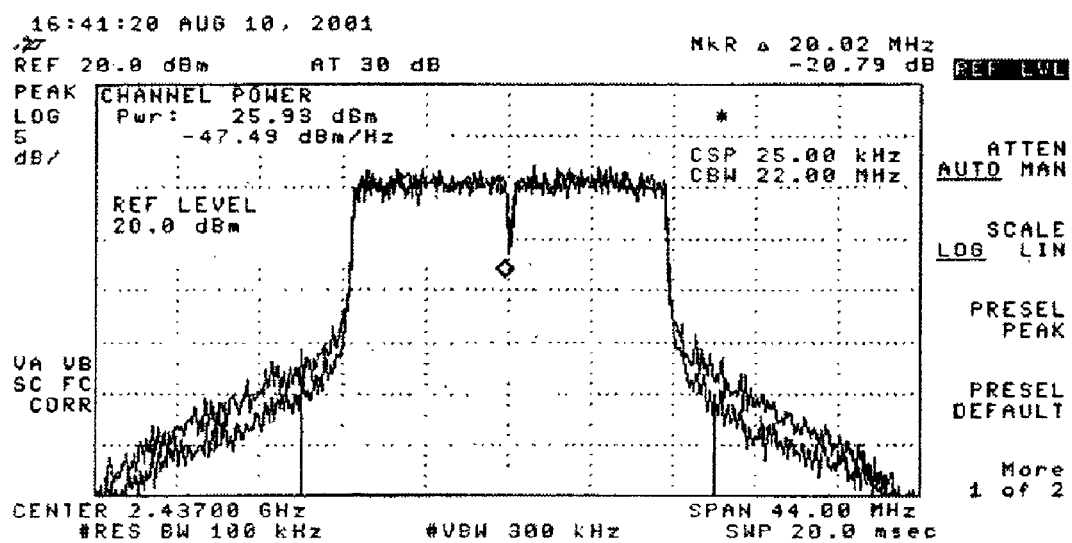
FIG. 25 depicts results from the test setup.

FIG. 25 shows the peak PSD for the RFMD 2.4 GHz PA both without and with predistortion measured using the test setup outlined above. The digital samples were generated in Matlab using PA measurements, with osr=4, $W_T$=1, $N_{cp}$=16 and a 16-point QAM constellation. The IF gain was set to 8 dB and no mixer imbalance was added. The simulation indicated $\rho_{clip}$=0.213015, a PA gain of 21.3 dB without PD and 21.3−1.2=20.1 dB with PD (the PD gain was 1.2 dB). Cubic spline interpolation was used with length 128 lookup tables.

During the test, the output power of the PA (with and without PD) was 20.21 dB, the PA gain without PD was 20.57 dB and the PA gain with PD was 19.86 dB. As seen from the figure, an improvement of about 3 dB was seen— this corresponded exactly to the gain expected from Matlab simulation.

CONCLUSION

Predistortion filtering for OFDM symbols and particularly 802.11a was presented. This included examining the theory, implementation and performance of various predistortion techniques, the methods for characterizing power amplifiers as well as the measured characteristics of several PA's, and finally, the training procedures required to incorporate predistortion into production devices.

This inventor concluded that predistortion (and particularly the cubic spline based predistortion) improves the transmit PSD mask by suppressing out-of-band harmonics and improves the transmit signal integrity which results in a significant (on the order of several dB) improvement in the link margin. The worst-case complexity of the cubic spline predistorter (which is the most complex of those considered) should be less than 8,000 gates and could be as small as 4,000 gates.

The performance results obtained were for the RFMD 2.4 GHz PA (which was considered a better than average PA). The results will differ for other PA's, however, it is expected that the gains from applying predistortion will remain on the order of several dB or better.

This inventor found that a cubic spline predistorter should be implemented into the baseband transmitter for OFDM systems and the like. It appears to be a relatively low cost method of boosting the transmitter performance, increasing link margin and improving production yields. Conservatively estimated, the complexity increase in gates over an 802.11a implementation is only about 0.5%. An option to disable the predistorter could be provided as a fail-safe with minimal impact on the chipset cost.

Appendix of Mathematical Derivations
Signed Envelope Function

The envelope of a modulated RF carrier is derived here.

Given that the I and Q signals change very slowly relatively to the carrier, we can assume that over a single period of the carrier, the I and Q signals are constant. Thus, the location of the peak during that period can be computed by solving the derivative at zero as follows (where the substitution, $\theta=\omega_c t$, was made to simplify notation)

$$\frac{d\hat{y}(t)}{d\theta} = \frac{d}{d\theta}[\hat{y}_I\cos(\theta) + \hat{y}_Q\sin(\theta)] = -\hat{y}_I\sin(\theta) + \hat{y}_Q\cos(\theta) = 0$$

$$\therefore \theta_{peak} = \tan^{-1}(\hat{y}_Q/\hat{y}_I)$$

Thus, the real-valued envelope of the RF signal is (after careful simplification)

$$r(t) = \hat{y}_I(t)\cos[\tan^{-1}(\hat{y}_Q(t)/\hat{y}_I(t))] + \hat{y}_Q(t)\sin[\tan^{-1}(\hat{y}_Q(t)/\hat{y}_I(t))]$$

$$= \text{sign}(\hat{y}_I(t))\sqrt{\hat{y}_I^2(t) + \hat{y}_Q^2(t)}$$

Note that the sign term can be removed if the phase is computed using a four-quadrant inverse tangent function.

Maximum OFDM Signal Levels

The time-domain representation of an OFDM signal is computed as the IFFT of a set of N complex constellation points $d_n = d_n^R + jd_n^I$ $$x(k) = \frac{1}{N}\sum_{n=0}^{N-1}(d_n^R + jd_n^I)[\cos(2\pi nk/N) + j\sin(2\pi nk/N)]$$

for $k=0, 1, \ldots, N-1$.

The complex points $d_n$ are modulated (according to 802.11a) using either BPSK, QPSK, 16-QAM or 64-QAM (i.e. no adaptive loading). Of interest here is the maximum (or minimum) values for Re[x(k)], Im[x(k)] and [x(k)] as required to compute the crest factors and determine the word-sizes required to represent these maximum values. It is assumed that all combinations of points within a constellation can occur (this is the worst case assumption—it is likely, given the scrambling, coding and interleaving, that this will never occur).

Consider first (expanding the above equation and separating into real and imaginary parts):

$$\text{Re}[x(k)] = \frac{1}{N}\sum_{n=0}^{N-1}[d_n^R\cos(2\pi nk/N) - d_n^I\sin(2\pi nk/N)]$$

$$\text{Im}[x(k)] = \frac{1}{N}\sum_{n=0}^{N-1}[d_n^I\cos(2\pi nk/N) + d_n^R\sin(2\pi nk/N)]$$

for $k=0, 1, \ldots, N-1$.

In the real case, a maximum is obtained when the signs of $d_n^R$ and the cosine terms are equal and the signs of $d_n^I$ and the sine terms are opposite over all n. Similarly, in the imaginary case, a maximum is obtained when the signs of $d_n^R$ and the sine terms are equal and the signs of $d_n^I$ and the cosine terms are equal over all n. For the BPSK case (where $d_n^I=0$), the maximum is thus $$\text{Re}[x_{BPSK}(k)]_{\max} = \frac{|d_{BPSK}^R|_{\max}}{N}\sum_{\substack{n=0\\data}}^{N-1}|\cos(2\pi nk/N)|$$

$$\text{Im}[x_{BPSK}(k)]_{\max} = \frac{|d_{BPSK}^R|_{\max}}{N}\sum_{\substack{n=0\\data}}^{N-1}|\sin(2\pi nk/N)|$$

for $k=0, 1, \ldots, N-1$ where the summations are performed over only those sub-carriers n that contain data (i.e. for $d_n^R \ne 0$). Similarly, for the QPSK, 16-QAM and 64-QAM cases $$\text{Re}[x(k)]_{\max} = \text{Im}[x(k)]_{\max} = \frac{|d^{R,I}|_{\max}}{N}\left[\sum_{\substack{n=0\\data}}^{N-1}|\cos(2\pi nk/N)| + |\sin(2\pi nk/N)|\right]$$

for $k=0, 1, \ldots, N-1$.

Figure 26:
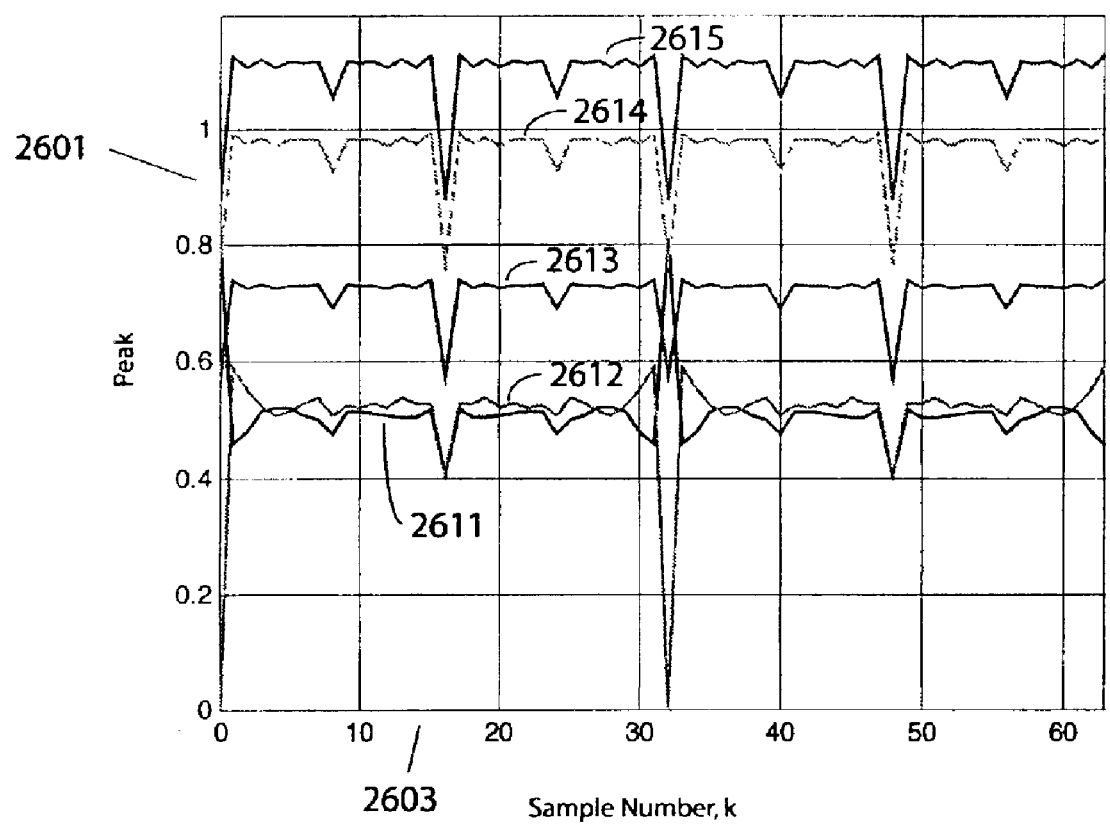
FIGS. 26 and 27, referenced in the appendix of calculations, illustrate analytical evaluations of maximum values during signal transmission for various constellations.

For every sample instant k, these expressions were analytically evaluated to obtain a maximum. The overall maximum is simply the maximum of these maximums. FIG. 26 illustrates the results of these maximums assuming 52 carriers (48 data plus 4 pilots) for BPSK (real 2611 and imaginary 2612 components), QPSK 2613, 16-QAM 2614 and 64-QAM 2615 (the effect of the $K_{MOD}$ factors used to normalize the energy of the constellations is included). The y-axis 2601 plots peaks and the x-axis 2603 plots sample number.

Using a similar approach the maximum $|x(k)|$ can be determined by maximizing $$|x(k)|^2 = \left\{\frac{1}{N}\sum_{n=0}^{N-1}[d_n^R\cos(2\pi nk/N) - d_n^I\sin(2\pi nk/N)]\right\}^2 +$$
$$\left\{\frac{1}{N}\sum_{n=0}^{N-1}[d_n^I\cos(2\pi nk/N) + d_n^R\sin(2\pi nk/N)]\right\}^2$$

for $k=0, 1, \ldots, N-1$.

This equation can be rearranged into the following form using standard identities $$|x(k)|^2 = \frac{1}{N^2}\sum_{n=0}^{N-1}\sum_{n'=0}^{N-1}\left\{\begin{array}{l}(d_n^R d_{n'}^R + d_n^I d_{n'}^I)\cos[2\pi(n-n')k/N] + \\ 2d_n^R d_{n'}^I \sin[2\pi(n-n')k/N]\end{array}\right\}$$

for $k=0, 1, \ldots, N-1$.

Again, by selecting the appropriate signs, the maximum values can be obtained. (The table below illustrates the signs required to maximize the magnitude of an OFDM signal).

| cos | sin | $d_n^R$ | $d_n^I$ | $d_{n'}^R$ | $d_{n'}^I$ |
|-----|-----|---------|---------|------------|------------|
| +   | +   | +       | +       | +          | +          |
|     |     | −       | −       | −          | −          |
|     |     | +       | −       | +          | −          |
|     |     | −       | +       | −          | +          |
| −   | +   | +       | −       | −          | +          |
|     |     | −       | +       | +          | −          |
|     |     | +       | −       | −          | +          |
|     |     | −       | +       | +          | −          |

Thus, for BPSK case (where $d_n^I=0$), the maximum is $$|x_{BPSK}(k)|_{\max}^2 = \frac{|d_{BPSK}^R|_{\max}^2}{N^2}\sum_{\substack{n=0\\data}}^{N-1}\sum_{\substack{n'=0\\data}}^{N-1}|\cos(2\pi(n-n')k/N)|$$

for $k=0, 1, \ldots, N-1$ where the summations are performed over only those sub-carriers n and n' which contain data (i.e. $d_n^R \ne 0$). Similarly, for the QPSK, 16-QAM and 64-QAM cases $$|x(k)|_{\max}^2 = 2\frac{|d^{R,I}|_{\max}^2}{N^2}\sum_{\substack{n=0\\data}}^{N-1}\sum_{\substack{n'=0\\data}}^{N-1}\left\{\begin{array}{l}|\cos(2\pi(n-n')k/N)| + \\ |\sin(2\pi(n-n')k/N)|\end{array}\right\}$$

for $k=0, 1, \ldots, N-1$

Figure 27:
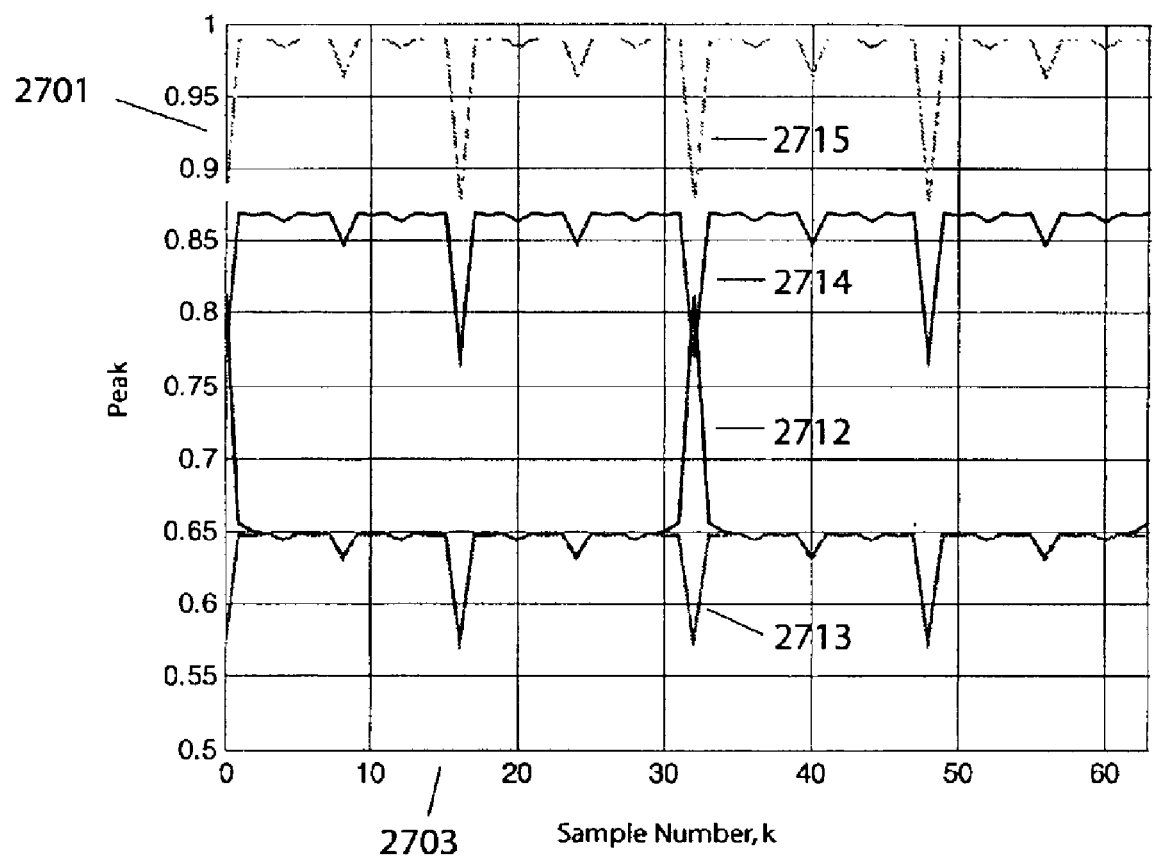

The above equations were evaluated to obtain a maximum value for each sample k. Me maximum over all k is simply the maximum of these maximums. FIG. 27 illustrates the results of these maximums assuming 52 carriers (48 data plus 4 pilots) for BPSK 2712, QPSK 2713, 16-QAM 2714 and 64-QAM 2715 (the effect of the $K_{MOD}$ factors used to normalize the energy of the constellations is included).

The table below summarizes the results, taking peak values from FIG. 26 and FIG. 27. Oversampling was not performed (i.e., $N_{fft}=64$)—oversampling may result in some small increases in these values.

| Constellation | Peak I/Q Amplitude | Peak Magnitude |
|---------------|--------------------|-----------------|
| BPSK          | (I) 0.812500       | 0.812500        |
|               | (Q) 0.591187       |                 |

-continued

| Constellation | Peak I/Q Amplitude | Peak Magnitude |
|---|---|---|
| QPSK | 0.741020 | 0.647951 |
| 16-QAM | 0.994183 | 0.869317 |
| 64-QAM | 1.131927 | 0.989761 |

Average RX Phase Error (Ideal)

Averaged error vector magnitude, as a function of $\theta$ (phase error) is $$EVM(\theta) = \int_0^\infty |ze^{-j\theta} - x/\rho_{clip}|^2 p(\rho)d\rho.$$

The goal is to minimize this as a function of $\theta$. Of course, this implies taking the derivative of the error vector magnitude with respect to $\theta$, setting it to zero and solving for $\theta$. The derivative is derived as follows:

$$\frac{d}{d\theta}EVM(\theta) = \frac{d}{d\theta}\int_0^\infty |ze^{-j\theta} - x/\rho_{clip}|^2 p(\rho)d\rho$$

Using the property $|x|^2 = x_1^2 + x_Q^2$, this can be rewritten as $$\frac{d}{d\theta}EVM(\theta) = \frac{d}{d\theta}\int_0^\infty \left[ \begin{array}{c} Re\{ze^{-j\theta} - x/\rho_{clip}\}^2 + \\ Im\{ze^{-j\theta} - x/\rho_{clip}\}^2 \end{array} \right] p(\rho)d\rho$$

Applying $e^{-j\theta} = \cos\theta - j\sin\theta$, the real and imaginary functions can be evaluated $$\frac{d}{d\theta}EVM(\theta) = \frac{d}{d\theta}\int_0^\infty \left[ \begin{array}{c} \{z_I\cos\theta + z_Q\sin\theta - x_I/\rho_{clip}\}^2 + \\ \{z_Q\cos\theta - z_I\sin\theta - x_Q/\rho_{clip}\}^2 \end{array} \right] p(\rho)d\rho$$

Squaring both terms in the integral and simplifying, this becomes $$\frac{d}{d\theta}EVM(\theta) = \frac{d}{d\theta}\int_0^\infty \left[ \begin{array}{c} z_I^2 + z_Q^2 + (x_I^2 + x_Q^2)/\rho_{clip}^2 - \\ 2(z_I x_I + z_Q x_Q)/\rho_{clip}\cos\theta - \\ 2(z_Q x_I - z_I x_Q)/\rho_{clip}\sin\theta \end{array} \right] p(\rho)d\rho$$

Given that the $\theta$ and $\rho$ terms are separate, the order of integration and differentiation can be switched (where the top line is not a function of $\theta$ and thus disappears in the differentiation) to get $$\frac{d}{d\theta}EVM(\theta) = -\frac{d}{d\theta}\cos\theta\int_0^\infty [2(z_I x_I + z_Q x_Q)/\rho_{clip}]p(\rho)d\rho -$$

$$\frac{d}{d\theta}\sin\theta\int_0^\infty [2(z_Q x_I + z_I x_Q)/\rho_{clip}]p(\rho)d\rho =$$

$$\frac{2\sin\theta}{\rho_{clip}}\int_0^\infty [z_I x_I + z_Q x_Q]p(\rho)d\rho - \frac{2\cos\theta}{\rho_{clip}}\int_0^\infty [z_Q x_I + z_I x_Q]p(\rho)d\rho$$

Equating this to zero and using the property $\tan\theta = \sin\theta/\cos\theta$, the ideal $\theta$ that minimizes the average error vector magnitude can be found $$\theta = \tan^{-1}\frac{\int_0^\infty [z_Q x_I + z_I x_Q]p(\rho)d\rho}{\int_0^\infty [z_I x_I + z_Q x_Q]p(\rho)d\rho}.$$

PSD of the Baseband Signal without Predistortion

By definition, the PSD of the signal x(t) is $$S_{xx}(f) = \lim_{T\to\infty} \frac{1}{T}E[|X_k(f,T)|^2]$$

where $X_k(f,T)$ is the Fourier transform of $x_k(t)$ for the k-th observation ensemble and T is the ensemble duration. When $x_k(t)$ is a single OFDM symbol, it is hypothesized that taking T to the limit is unnecessary given that the expected value of $|X_k(f,T)|^2$ will be time invariant. Thus, for OFDM $$S_{xx}(f) = E[|X_k(f)|^2].$$

The baseband signal, for the 1-th OFDM symbol is defined as $$x(k) = w_T(k)\frac{1}{N}\sum_{n=0}^{N-1} d_n^{(l)} e^{j2\pi nk/N} \text{ for } k = -N_{cp}, \ldots, 0, 1, \ldots, N-1,$$

where $w_T(k)$ is a raised cosine windowing function, $d_n^{(1)}$ is a complete QAM constitution point representing the data, and $N+N_{cp}$ is the duration of the OFDM symbol where $N_{cp}$ is the length of the cyclic prefix.

The windowing function is $$w_T(t) = \begin{cases} 0 & t < -(T+T_{tr})/2 \\ \cos^2\left\{\frac{\pi}{2T_{tr}}[t+(T-T_{tr})/2]\right\} & -(T+T_{tr})/2 \leq t \leq -(T-T_{tr})/2 \\ 1 & -(T-T_{tr})/2 < t < (T-T_{tr})/2 \\ \cos^2\left\{\frac{\pi}{2T_{tr}}[t-(T-T_{tr})/2]\right\} & (T-T_{tr})/2 \leq t \leq (T+T_{tr})/2 \\ 0 & t > (T+T_{tr})/2 \end{cases}$$

where $T_{tr}$ is the transition time, or overlap, between adjacent OFDM symbols. The Fourier transform of $w_T(t)$ can be computed in parts beginning with the two cosine terms (equating the ranges of integration and using $\cos A = (e^{jA} + e^{-jA})/2$)

$$W_T^{(\cos)}(\omega) = \int_{-(T+T_{tr})/2}^{-(T-T_{tr})/2} \cos^2\left\{\frac{\pi}{2T_{tr}}[t+(T-T_{tr})/2]\right\}e^{-j\omega t}dt +$$

$$\int_{(T-T_{tr})/2}^{(T+T_{tr})/2} \cos^2\left\{\frac{\pi}{2T_{tr}}[t-(T-T_{tr})/2]\right\}e^{-j\omega t}dt$$

$$= 2\int_{(T-T_{tr})/2}^{(T+T_{tr})/2} \cos^2\left\{\frac{\pi}{2T_{tr}}[t-(T-T_{tr})/2]\right\}\cos(\omega t)dt$$

Using $\cos^2 A = (1+\cos 2A)/2$ and $\cos(A\pm B) = \cos A \cos B \pm \sin A \sin B$, $$W_T^{(\cos)}(\omega) = \int_{(T-T_{tr})/2}^{(T+T_{tr})/2} \left\{\cos(\omega t) + \cos\left\{\frac{\pi}{T_{tr}}[t-(T-T_{tr})/2]\right\}\cos(\omega t)\right\}dt$$

$$= \int_{(T-T_{tr})/2}^{(T+T_{tr})/2} \cos(\omega t)dt +$$

-continued $$\cos[\pi(T-T_{tr})/2T_{tr}]\int_{(T-T_{tr})/2}^{(T+T_{tr})/2}\cos(\pi t/T_{tr})\cos(\omega t)dt +$$

$$\sin[\pi(T-T_{tr})/2T_{tr}]\int_{(T-T_{tr})/2}^{(T+T_{tr})/2}\sin(\pi t/T_{tr})\cos(\omega t)dt$$

Each of the integrals in the above equation can now be evaluated to get $$W_T^{(\cos)}(\omega) = \frac{1}{\omega}\{\sin[\omega(T+T_{tr})/2] - \sin[\omega(T-T_{tr})/2]\} +$$

$$\cos[\pi(T-T_{tr})/2T_{tr}]\left\{\begin{array}{c}\frac{\sin[(\pi/T_{tr}+\omega)(T+T_{tr})/2] - \sin[(\pi/T_{tr}+\omega)(T-T_{tr})/2]}{2(\pi/T_{tr}+\omega)} + \\ \frac{\sin[(\pi/T_{tr}-\omega)(T+T_{tr})/2] - \sin[(\pi/T_{tr}-\omega)(T-T_{tr})/2]}{2(\pi/T_{tr}-\omega)}\end{array}\right\} -$$

$$\sin[\pi(T-T_{tr})/2T_{tr}]\left\{\begin{array}{c}\frac{\cos[(\pi/T_{tr}+\omega)(T+T_{tr})/2] - \cos[(\pi/T_{tr}+\omega)(T-T_{tr})/2]}{2(\pi/T_{tr}+\omega)} \\ \frac{\cos[(\pi/T_{tr}-\omega)(T+T_{tr})/2] - \cos[(\pi/T_{tr}-\omega)(T-T_{tr})/2]}{2(\pi/T_{tr}-\omega)}\end{array}\right\}$$

This can be simplified (using various trigonometric identities) into the following form $$W_T^{(\cos)}(\omega) = \frac{1}{\omega}\{\sin[\omega(T+T_{tr})/2] - \sin[\omega(T-T_{tr})/2]\} +$$

$$\frac{\omega}{(\pi/T_{tr})^2 - \omega^2}\{\sin[\omega(T+T_{tr})/2] + \sin[\omega(T-T_{tr})/2]\}$$

Finally, the Fourier transform of the unity portion of $w_T(t)$ is found $$W_T^{(step)}(\omega) = \int_{-(T-T_{tr})/2}^{(T-T_{tr})/2} e^{-j\omega t}dt = \frac{2}{\omega}\sin[\omega(T-T_{tr})/2]$$

Summing the Fourier transforms of the two individual parts and simplifying, $$W_T(\omega) =$$

$$\frac{\pi^2}{\omega(\pi^2 - T_{tr}^2\omega^2)}\{\sin[\omega(T+T_{tr})/2] + \sin[\omega(T-T_{tr})/2]\} \text{ and } W_T(0) = T$$

Note that when $T_{tr}=0$, $W_T(\omega)$ reverts to the sine function as expected. Also note that the locations of the zero crossings are not a function of $T_{tr}$ (provided $T+T_{tr}$ is integer) which is a necessary requirement to ensure the orthogonality of the individual OFDM carriers.

Finally, given that each sub-carrier of $x_k(t)$ is independent and the product of the sub-carrier and $w_T(t)$, the PSD for one sub-carrier is simply the correlation of the dirac function at the subcarrier frequency and the Fourier transform of the windowing function derived above. Thus, the PSD of sum of $x_k(t)$ is simply $$S_{xx}(f) = \sum_n \frac{\sin[\pi(f-f_c(n))(T+T_{tr})] + \sin[2\pi(f-f_c(n))(T-T_{tr})]}{2\pi(f-f_c(n))(1 - 4T_{tr}^2(f-f_c(n))^2)}$$

where $f_c(n)$ is the center frequency of the n-th subcarrier and the summation is taken over all active carriers.

While the present invention is disclosed by reference to the preferred embodiments and examples detailed above, it is understood that these examples are intended in an illustrative rather than in a limiting sense. Computer-assisted processing is implicated in the described embodiments. Accordingly, the present invention may be embodied in methods for computer-assisted processing, systems including logic to implement the methods, media impressed with logic to carry out the methods data streams impressed with logic to carry out the methods, or computer-accessible processing services. It is contemplated that modifications and combinations will readily occur to those skilled in the art, which modifications and combinations will be within the spirit of the invention and the scope of the following claims.

I claim:

1. A method of calibrating a system including a predistorter in communication with a power amplifier, including:
   over a range of probabilities of clipping an OFDM symbol,
      calculating clipping noise resulting from calibrating an input range to the predistorter to a particular probability of clipping; and
      determining tolerance to random noise resulting from operating at an average power output of the power amplifier corresponding to the particular probability of clipping;
   selecting a parameter corresponding to a preferred probability of clipping an OFDM symbol; and
   calibrating the input range to the predistorter and the average power output of the power amplifier to the parameter.

2. A method of calibrating an OFDM symbol transmission system including: a predistorter in communication with a power amplifier, including:
   over a range of power amplifier power back-offs,
      calculating a probability of clipping an OFDM symbol corresponding to a particular power back-off and a corresponding clipping noise; and
      determining tolerance of the system to random noise resulting from the particular power back-off;
   selecting a preferred power back-off corresponding to the clipping noise and tolerance of random noise; and
   calibrating a predistortion pattern of the predistorter and the average power output of the power amplifier to the selected power back-off.

3. The method of claim 2, wherein determining the tolerance further includes simulating response of the system to a plurality of OFDM symbols.

4. The method of claim 2, wherein determining the tolerance further includes measuring error vectors of a signal received for the OFDM symbol transmission system.

5. The method of claim 4, wherein the signal is measured with minimal environmental noise.

6. A method of determining a predistortion pattern and a power back-off setting for a system including a predistorter in communication with a power amplifier, the method including:
   measuring a PA response curve of the power amplifier and deriving an inverse PA response curve;
   from a range of power back-off settings, selecting a particular power back-off setting corresponding to a calculated OFDM symbol clipping noise and to random noise tolerance of the system;
   mapping an upper input threshold derived from the particular power back-off to an output level of the power amplifier that will be saturated or nearly saturated; and loading the system with the inverse PA response curve scaled to the upper input threshold and with a power back-off parameter.

7. The method of claim 6, further including adjusting the particular power back-off to take into account additional sources of noise.

8. The method of claim 6, further including adjusting the particular power back-off to take into account regulatory limits on RF emission.

9. The method of claim 7, further including adjusting the particular power back-off to take into account regulatory limits on RF emission.

10. The method of claim 6, wherein the power amplifier measured is considered typical of power amplifiers used in the loaded system.

11. The method of claim 6, wherein the power amplifier measured is a component of the loaded system.

12. A method of configuring a system including a predistorter in communication with a power amplifier, the method including:
    calculating a first parameter that maximizes a tolerance of the system to a combination of clipping noise and random noise for an OFDM symbol sequence;
    deriving from the first parameter a power back-off value for the power amplifier and an upper input threshold for the predistorter;
    determining an inverse response curve corresponding to a PA response curve and to the upper input threshold; and
    loading the system with a representation of the inverse response curve and with the power back-off value.

13. The method of claim 12, wherein the representation of the inverse response curve is a cubic spline look-up table.

14. The method of claim 12, further including adjusting the first parameter to take into account regulatory limits on RF emission.

15. The method of claim 12, further including adjusting the first parameter in a range resulting in a decrease of 0.5 dB to an increase of 2 dB in the power back-off value.

16. The method of claim 12, further including adjusting the first parameter in a range resulting in a decrease of 0.5 dB to an increase of 4 dB in the power back-off value.

17. The method of claim 12, further including adjusting the first parameter in a range resulting in a decrease of 0.5 dB to an increase of 8 dB in the power back-off value.

18. The method of claim 12, wherein the PA response curve is measured from a one or more sample power amplifiers considered typical of power amplifiers used in the loaded system.

19. The method of claim 12, wherein the PA response curve is measured from a component of the loaded system.

20. A method of determining an upper input threshold for a predistorter in communication with a power amplifier, the method including:
    determining a power probability distribution for a sample OFDM symbol sequence;
    determining a PA response curve;
    selecting an ideal response curve for which a weighted sum of differences between corresponding points along the ideal response curve and the PA response curve is approximately zero, wherein weights correspond to the power probability distribution; and
    deriving a power-off value from a point on the selected ideal response curve at which output of the power amplifier will saturate or nearly saturate.

21. The method of claim 20, wherein the ideal response curve is represented as a straight line.

22. The method of claim 21, wherein a predistortion curve is calculated as a cubic spline transformation of the ideal response curve to the PA response curve.

* * * * *